(12) United States Patent
Lee et al.

(10) Patent No.: US 10,522,230 B2
(45) Date of Patent: Dec. 31, 2019

(54) NONVOLATILE MEMORY DEVICE HAVING A RECOVERY OPERATION CONDITIONED ON AN OPERATION MODE, OPERATION METHOD THEREOF, AND STORAGE DEVICE INCLUDING THE SAME

(71) Applicant: SAMSUNG ELECTRONICS CO., LTD., Suwon-si, Gyeonggi-Do (KR)

(72) Inventors: Dae Yeal Lee, Osan-si (KR); Jaewoo Im, Yongin-si (KR); Jae-Hak Yun, Hwaseong-si (KR); Kangguk Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/957,149

(22) Filed: Apr. 19, 2018

(65) Prior Publication Data

US 2019/0035478 A1 Jan. 31, 2019

(30) Foreign Application Priority Data

Jul. 25, 2017 (KR) .................. 10-2017-0094398

(51) Int. Cl.
*G11C 16/30* (2006.01)
*G11C 5/14* (2006.01)
(Continued)

(52) U.S. Cl.
CPC .............. *G11C 16/30* (2013.01); *G11C 5/147* (2013.01); *G11C 7/04* (2013.01); *G11C 11/5628* (2013.01); *G11C 16/10* (2013.01); *G11C 16/14* (2013.01); *G11C 16/26* (2013.01); *G11C 16/3418* (2013.01); *G11C 11/5671* (2013.01); *G11C 16/0483* (2013.01)

(58) Field of Classification Search
CPC .. G11C 7/04; G11C 5/148; G11C 7/22; G11C 11/5628; G11C 11/5671; G11C 16/0483; G11C 16/10; G11C 16/14; G11C 16/26; G11C 16/30; G11C 16/3418; G11C 5/147
USPC .................. 365/185.2, 185.04, 226, 228
See application file for complete search history.

(56) References Cited

U.S. PATENT DOCUMENTS

| | | |
|---|---|---|
| 5,122,920 A | 6/1992 | Pease |
| 5,301,161 A | 4/1994 | Landgraf et al. |

(Continued)

FOREIGN PATENT DOCUMENTS

| | | |
|---|---|---|
| JP | 2006-115594 | 4/2006 |
| KR | 10-1334634 | 11/2013 |
| KR | 1020150051708 | 5/2015 |

*Primary Examiner* — Gene N Auduong
(74) *Attorney, Agent, or Firm* — F. Chau & Associates, LLC

(57) ABSTRACT

A method of operating a nonvolatile memory device is provided. The nonvolatile memory device includes a memory cell array including a plurality of memory cells. The method includes: the nonvolatile memory device determining an operation mode based on the received command, the nonvolatile memory device generating a comparison voltage based on the determined operation mode, the nonvolatile memory device comparing the comparison voltage with a reference voltage to generate a result, and the nonvolatile memory device performing a recovery operation on at least one of the memory cells depending on the result.

19 Claims, 20 Drawing Sheets

(51) Int. Cl.
  *G11C 7/04*   (2006.01)
  *G11C 11/56*  (2006.01)
  *G11C 16/10*  (2006.01)
  *G11C 16/14*  (2006.01)
  *G11C 16/26*  (2006.01)
  *G11C 16/34*  (2006.01)
  *G11C 16/04*  (2006.01)

(56) References Cited

U.S. PATENT DOCUMENTS

| | | | |
|---|---|---|---|
| 5,896,338 A | 4/1999 | Landgraf et al. | |
| 6,434,653 B1 * | 8/2002 | Winston | G06F 1/18 710/301 |
| 6,629,047 B1 * | 9/2003 | Guliani | G11C 5/147 702/108 |
| 6,789,159 B1 * | 9/2004 | Carr | G11C 16/22 365/185.33 |
| 7,392,408 B2 | 6/2008 | Moon et al. | |
| 7,450,359 B1 | 11/2008 | Mei et al. | |
| 7,463,543 B2 | 12/2008 | Kwak | |
| 7,689,760 B2 * | 3/2010 | Carr | G11C 16/22 711/103 |
| 8,558,527 B2 | 10/2013 | Sasaki et al. | |

* cited by examiner

NONVOLATILE MEMORY DEVICE HAVING A RECOVERY OPERATION CONDITIONED ON AN OPERATION MODE, OPERATION METHOD THEREOF, AND STORAGE DEVICE INCLUDING THE SAME

CROSS-REFERENCE TO RELATED APPLICATIONS

A claim for priority under 35 U.S.C. § 119 is made to Korean Patent Application No. 10-2017-0094398 filed on Jul. 25, 2017, in the Korean Intellectual Property Office, the disclosure of which is incorporated by reference herein.

BACKGROUND

1. Technical Field

Exemplary embodiments of the inventive concept disclosed herein relate to a semiconductor memory, and more particularly, to a nonvolatile memory device, an operation method of the nonvolatile memory device, and a storage device including the same.

2. Discussion of Related Art

Semiconductor memory devices are classified into volatile memory devices, which do not retain data stored therein at power-off, such as a static random access memory (SRAM), a dynamic RAM (DRAM), and a synchronous DRAM (SDRAM), and nonvolatile memory devices, which retain data stored therein even at power-off, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

The flash memory device is widely used as a large-capacity storage medium of a computing system. The flash memory device operates by using a power supply voltage provided from an outside source. However, when the power supply voltage becomes unstable, it is difficult to secure the reliability of data stored in the flash memory device.

SUMMARY

At least one exemplary embodiment of the inventive concept provides a nonvolatile memory device with improved reliability, an operation method of the nonvolatile memory device, and a storage device including the nonvolatile memory device.

According to an exemplary embodiment of the inventive concept, a method of operating of a nonvolatile memory device is provided. The method includes the nonvolatile memory device determining an operation mode based on a command received from an external device, generating a comparison voltage based on the determined operation mode, comparing the comparison voltage with a reference voltage to generate a result, and performing a recovery operation depending on the result.

According to an exemplary embodiment of the inventive concept, a nonvolatile memory device is provided. The nonvolatile memory device includes a memory cell array including a plurality of memory cells, a voltage generator that generates a reference voltage and a plurality of operation voltages to be provided to the plurality of memory cells, based on a power supply voltage, a control logic circuit that determines an operation mode based on a command from an external device, and a voltage drop detector that generates a comparison voltage based on the determined operation mode, compares the comparison voltage with the reference voltage to generate a result, and outputs a lock-out signal depending on the result, where the lock-out signal causes a recovery operation to be performed.

According to an exemplary embodiment of the inventive concept, a storage device is provided. The storage device includes a nonvolatile memory device, and a memory controller that provides a command to the nonvolatile memory device to control the nonvolatile memory device. The memory controller includes a voltage drop detector that generates a comparison voltage based on an operation mode of the nonvolatile memory device corresponding to the command, compares the comparison voltage with a reference voltage to generate a result, and outputs a lock-out signal to the nonvolatile memory device depending on the result. The lock-out signal causes a recovery operation to be performed.

According to an exemplary embodiment of the inventive concept, a nonvolatile memory device is provided. The nonvolatile memory device includes a memory cell array and a control circuit. The memory cell array includes a plurality of memory cells. The control circuit is configured to generate a comparison voltage based on a voltage drop in an internal voltage and an operation mode of the nonvolatile memory device, apply a programming operation to at least one of the memory cells when the comparison voltage is greater than or equal to a reference voltage, and suspend the programming operation and perform a recovery operation on the at least one memory well when the comparison voltage is less than the reference voltage.

BRIEF DESCRIPTION OF THE FIGURES

The inventive concept will become apparent from the following description with reference to the following figures, wherein like reference numerals refer to like parts throughout the various figures unless otherwise specified, and wherein.

DETAILED DESCRIPTION

Below, exemplary embodiments of the inventive concept are described in detail and clearly to such an extent that one of an ordinary one in the art can implement the inventive concept.

Figure 1:
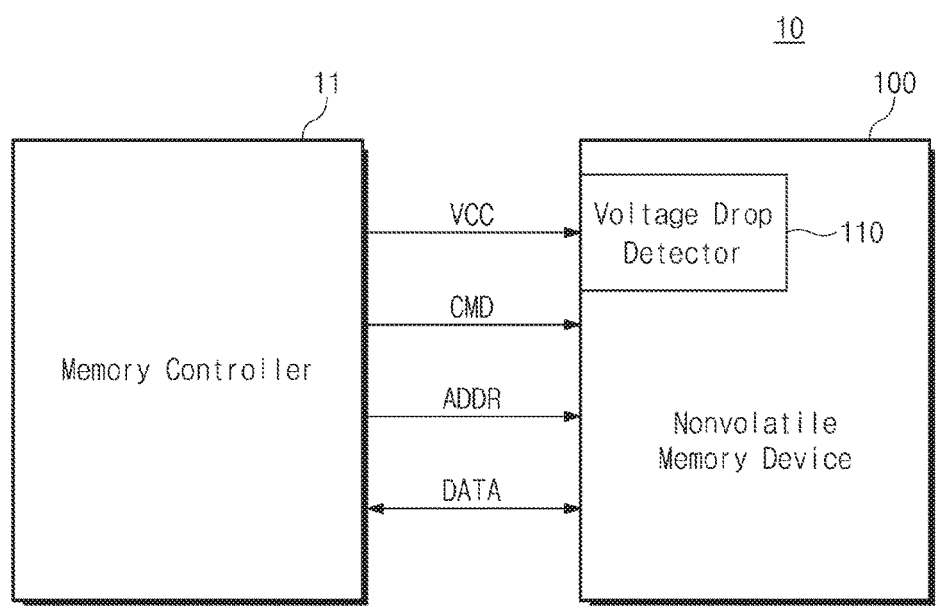
FIG. 1 is a block diagram illustrating a storage device according to an exemplary embodiment of the inventive concept.

FIG. 1 is a block diagram illustrating a storage device 10 according to an exemplary embodiment of the inventive concept. Referring to FIG. 1, the storage device 10 includes a memory controller 11 and a nonvolatile memory device 100.

The memory controller 11 may store data in the nonvolatile memory device 100 or may read data stored in the nonvolatile memory device 100. For example, the memory controller 11 may transmit a power supply voltage VCC, a command CMD, and an address ADDR to the nonvolatile memory device 100 to store data in the nonvolatile memory device 100 or to read data stored in the nonvolatile memory device 100.

The nonvolatile memory device 100 may receive the power supply voltage VCC, the command CMD, and the address ADDR from the memory controller 11. In response to the received signals, the nonvolatile memory device 100 may store data from the memory controller 11 or may provide data stored therein to the memory controller 11. In an exemplary embodiment below, a description will be provided under the assumption that the power supply voltage VCC is provided from the memory controller 11. However, exemplary embodiments of the inventive concept are not limited thereto. For example, the power supply voltage VCC may be provided from a separate power supply device (not illustrated).

The nonvolatile memory device 100 includes a voltage drop detector 110 (e.g., a circuit capable of detecting a voltage drop). The voltage drop detector 110 may detect whether the power supply voltage VCC from the memory controller 11 decreases to a reference voltage or lower. For example, the power supply voltage VCC provided from the memory controller 11 may decrease to the reference voltage or lower due to various factors such as a malfunction in an external power source device, a malfunction in a power circuit of the memory controller 11, a wiring issue, or an issue in an internal circuit of the nonvolatile memory device 100. The voltage drop detector 110 may detect whether the power supply voltage VCC decreases to the reference voltage or lower. In an exemplary embodiment, the voltage drop detector 110 is a lock-out circuit included in the nonvolatile memory device 100.

The nonvolatile memory device 100 may perform a recovery operation (or referred to as a "lock-out operation") depending on the detection result of the voltage drop detector 110. For example, as described above, in the case where the power supply voltage VCC decreases to a specific voltage or lower, the nonvolatile memory device 100 may fail to operate normally. Alternatively, in the case where the power supply voltage VCC decreases to a specific voltage or lower, there may be a decrease in the reliability of data stored in the nonvolatile memory device 100 or data to be stored therein. Accordingly, the nonvolatile memory device 100 may perform the recovery operation depending on the detection result of the voltage drop detector 110, thus securing the reliability of the stored data or the to-be-stored data.

The voltage drop detector 110 according to an exemplary embodiment of the inventive concept adjusts a comparison voltage based on an operation mode or an operation temperature of the nonvolatile memory device 100 or a combination thereof. In an exemplary embodiment, the comparison voltage indicates a target voltage of the comparison operation of the voltage drop detector 110. That is, the voltage drop detector 110 may perform a comparison operation for detecting whether the comparison voltage is lower or higher than the reference voltage.

In an exemplary embodiment, the operation mode of the nonvolatile memory device 100 may be determined based on an operating state, such as an idle state, a program operation, a read operation, or an erase operation, a way to operate, such as single/multi-page programming, single-level cell (SLC)/multi-level cell (MLC) programming, single/multi-page reading, or single memory block/sub block/multi-block/super block erasing, or various combinations thereof or may include the operating state and the way to operate. In an embodiment, a super block is two or more blocks and a sub block is a part of a single block.

In an exemplary embodiment, when the comparison voltage is adjusted depending on an operation mode, an operation temperature, or a combination thereof, a time point when the nonvolatile memory device 100 performs the recovery operation may be uniform, thereby making it possible to secure a sufficient time for performing the recovery operation or preventing an unnecessary trigger of the recovery operation. A comparison voltage adjusting method according to an exemplary embodiment of the inventive concept will be more fully described with reference to the following drawings.

Figure 2:
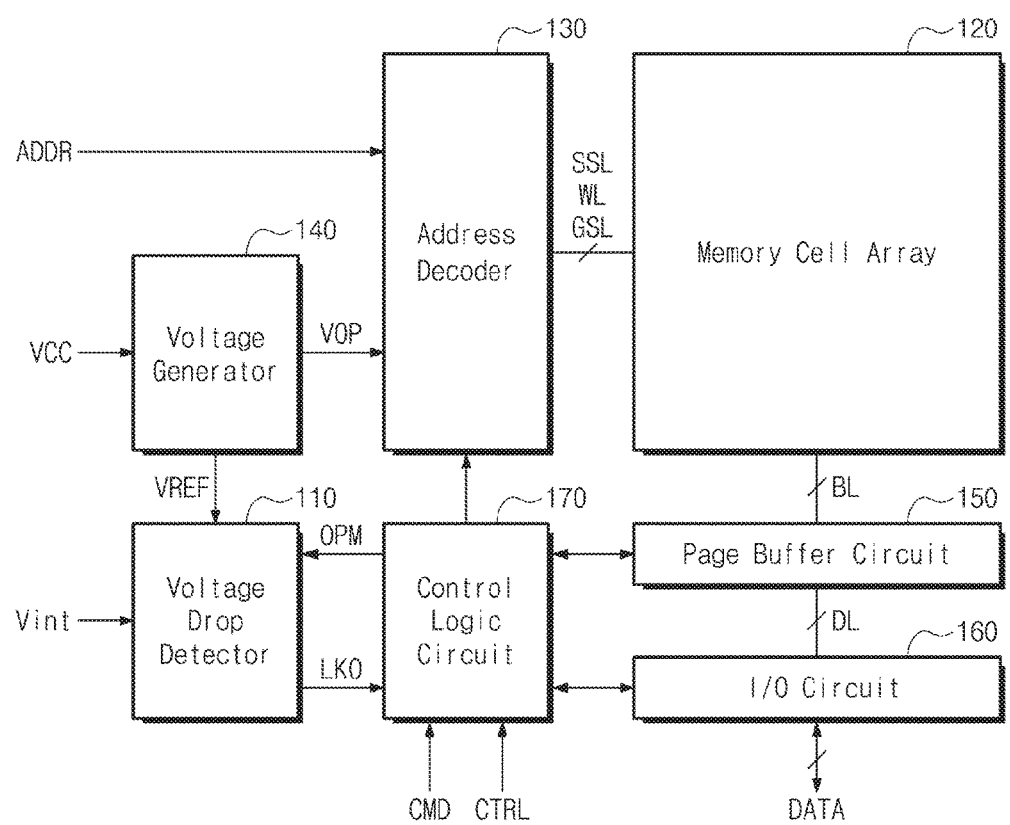
FIG. 2 is a block diagram illustrating a nonvolatile memory device of FIG. 1 according to an exemplary embodiment of the inventive concept.

FIG. 2 is a block diagram illustrating the nonvolatile memory device 100 of FIG. 1 according to an exemplary embodiment of the inventive concept. Referring to FIGS. 1 and 2, the nonvolatile memory device 100 includes the voltage drop detector 110, a memory cell array 120, an address decoder 130, a voltage generator 140, a page buffer circuit 150, an input/output circuit 160, and a control logic circuit 170. In an embodiment, a control circuit is provided that includes the control logic circuit 170, the voltage drop detector 110, and the voltage generator 140.

The voltage drop detector 110 receives an internal voltage Vint and a reference voltage VREF. In an exemplary embodiment, for brevity of illustration and convenience of description, the internal voltage Vint is illustrated as being independent of the power supply voltage VCC. However, exemplary embodiments of the inventive concept are not limited thereto. For example, the internal voltage Vint may be a voltage that depends on the power supply voltage VCC. In an embodiment, the internal voltage Vint is a voltage of VCC-Vdrop, in which Vdrop is a voltage dropped from the power supply voltage VCC by a wiring from a signal pin to receive the power supply voltage VCC to the voltage drop detector 110 or by a separate element.

In an exemplary embodiment, the voltage drop detector 110 is configured to generate a comparison voltage VCP based on the internal voltage Vint and to compare the generated comparison voltage VCP with the reference voltage VREF. The comparison voltage VCP may be a voltage that is obtained by dividing the internal voltage Vint through a voltage divider. For example, the voltage divider may include multiple resisters that are selectively used to alter the amount that the comparison voltage is divided by.

Even though the power supply voltage VCC input from the memory controller 11 is uniform, a level of the internal voltage Vint may vary depending on a current or a peak current used in the nonvolatile memory device 100, and thus, a level of the comparison voltage VCP based on the internal voltage Vint may vary depending on an operation mode. That is, the level of the comparison voltage VCP may vary depending on an operation mode of the nonvolatile memory device 100. In an exemplary embodiment, the internal voltage Vint is lower by a predetermined level than the power supply voltage VCC, and the comparison voltage VCP is lower by a predetermined level than the internal voltage Vint. The reference voltage VREF may be a preset voltage provided from the voltage generator 140.

The voltage drop detector 110 receives information OPM about an operation mode from the control logic circuit 170. Below, the information about an operation mode may be simply referred to as an "operation mode". The voltage drop detector 110 may generate the comparison voltage VCP (refer to FIG. 4) by using the internal voltage Vint, based on the received operation mode OPM. For example, the voltage drop detector 110 may generate the comparison voltage VCP by adjusting a voltage division ratio of the internal voltage Vint based on the operation mode OPM. For example, the comparison voltage VCP may be generated by dividing the internal voltage Vint by the voltage division ratio.

As described above, even though the same power supply voltage VCC is used, the internal voltage Vint may vary depending on an operation of the nonvolatile memory device 100. That is, since the comparison voltage VCP based on the internal voltage Vint being a comparison target varies depending on an operation mode of the nonvolatile memory device 100, a time point when a lock-out signal LKO is output may vary depending on an operation mode of the nonvolatile memory device 100, a margin (time margin) for a recovery operation may vary depending on an operation mode of the nonvolatile memory device 100, or an unnecessary recovery operation may trigger depending on an operation mode of the nonvolatile memory device 100.

In an exemplary embodiment, the voltage drop detector 110 generates the comparison voltage VCP based on the operation mode OPM and compares the comparison voltage VCP with the reference voltage VREF to output the lock-out signal LKO. For example, when the comparison voltage VCP is lower than the reference voltage VREF, the voltage drop detector 110 outputs the lock-out signal LKO to allow the nonvolatile memory device 100 to perform the recovery operation. That the comparison voltage VCP is lower than the reference voltage VREF means that the nonvolatile memory device 100 fails to operate normally.

In an embodiment where the comparison voltage VCP is not lower than the reference voltage VREF (in other words, the comparison voltage VCP is higher than or equal to the reference voltage VREF), the voltage drop detector 110 does not output the lock-out signal LKO. In other words, that the comparison voltage VCP is higher than the reference voltage VREF means that the nonvolatile memory device 100 operates normally. In an exemplary embodiment, the reference voltage VREF is used as the lock-out signal LKO.

The memory cell array 120 includes a plurality of memory blocks, each of which has a plurality of memory cells. The memory cells may be connected with a plurality of word lines WL. Each memory cell may be a single level cell (SLC) storing 1-bit data or a multi-level cell (MLC) storing data of two or more bits.

The address decoder 130 may be connected with the memory cell array 120 through string selection lines SSL, the word lines WL, and ground selection lines GSL. The address decoder 130 may receive an address ADDR from the memory controller 11. The address decoder 130 may receive various operation voltages VOP from the voltage generator 140. In an embodiment, the address decoder 130 decodes the received address ADDR and provides the corresponding operation voltages VOP to the string selection lines SSL, the word lines WL, and the ground selection lines GSL based on the decoded address.

The voltage generator 140 may receive the power supply voltage VCC from the memory controller 11. The voltage generator 140 may generate the various operation voltages VOP, which are required for the nonvolatile memory device 100 to operate, by using the received power supply voltage VCC. In an exemplary embodiment, the operation voltages VOP includes various levels of voltages such as program voltages, pass voltages, verification voltages, selection read voltages, non-selection read voltages, and erase voltages. The voltage generator 140 generates the reference voltage VREF and provides the generated reference voltage VREF to the voltage drop detector 110. In an exemplary embodiment, the reference voltage VREF generated in the voltage generator 140 has a preset level. Alternatively, although not illustrated in FIG. 2, the reference voltage VREF may be generated using a separate reference voltage generator (not illustrated).

The page buffer circuit 150 is connected with the memory cell array 120 through the bit lines BL. The page buffer circuit 150 may temporarily store data to be stored in the memory cell array 120 or data read from the memory cell array 120.

The input/output circuit 160 is connected with the page buffer circuit 150 through data lines DL and exchanges data with the page buffer circuit 150 through the data lines DL. Under control of the control logic circuit 170, the input/output circuit 160 transmits data to the memory controller 11 or receive data from the memory controller 11.

The control logic circuit 170 may control overall operations of the nonvolatile memory device 100. For example, the control logic circuit 170 may control the address decoder 130, the voltage generator 140, the page buffer circuit 150, and the input/output circuit 160 in response to a command CMD and a control signal CTRL from the memory controller 11.

In an exemplary embodiment, the control logic circuit 170 determines the operation mode OPM based on the command CMD and the control signal CTRL and provides the determined operation mode OPM to the voltage drop detector 110. For example, the control logic circuit 170 may receive the command CMD and the control signal CTRL associated with a multi-page program operation from the memory controller 11. The multi-page program operation refers to a program operation associated with a plurality of pages. The control logic circuit 170 may determine the operation mode OPM is a multi-page program mode, based on the command CMD and the control signal CTRL received. In an exemplary embodiment, the operation mode OPM includes information about an operating state, such as an idle state, a program operation, a read operation, or an erase operation, a way to operate, such as single/multi-page programming, SLC/MLC programming, single/multi-page reading, or single memory block/sub block/multi-block/super block erasing, or various combinations thereof.

As described above, the nonvolatile memory device 100 according to an embodiment of the inventive concept generates the comparison voltage VCP based on the operation mode OPM and compares the comparison voltage VCP with the reference voltage VREF, thereby making it possible to secure a sufficient margin for a recovery operation of the nonvolatile memory device 100. Thus, the performance of the nonvolatile memory device 100 may be improved. For example, the comparison voltage VCP could be a first voltage when the operation mode is a first mode and a second voltage when the operation mode is a second other mode, where the first and second voltages are different from one another.

Figure 3:
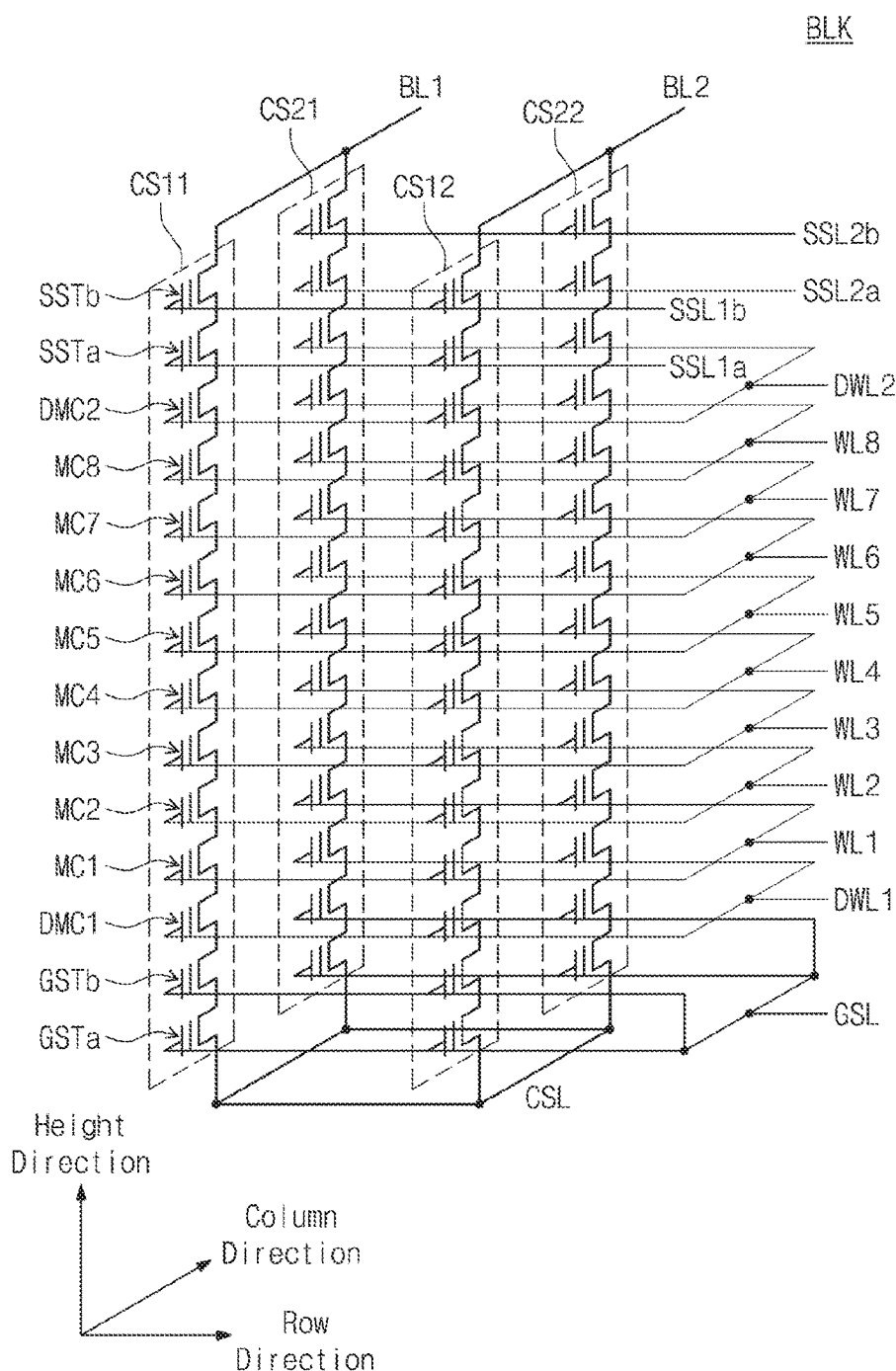
FIG. 3 is a circuit diagram illustrating a memory block included in a memory cell array of FIG. 2 according to an exemplary embodiment of the inventive concept.

FIG. 3 is a circuit diagram illustrating a memory block BLK included in a memory cell array of FIG. 2. In an exemplary embodiment, one memory block BLK included in the memory cell array 120 will be described with reference to FIG. 3. However, each of a plurality of memory blocks included in the memory cell array 120 may have the same structure as the memory block BLK of FIG. 3. In an exemplary embodiment, the memory block BLK illustrated in FIG. 3 is a physical erase unit of the nonvolatile memory device 100. In an embodiment, the physical erase unit is the smallest amount of memory that can be erased by an erase operation. For example, a physical erase unit can be a certain number of memory blocks. However, exemplary embodiments of the inventive concept may not be limited thereto. For example, an erase unit may be changed to a page unit, a word line unit, a sub block unit, etc.

Referring to FIG. 3, the memory block BLK may include a plurality of cell strings CS11, CS12, CS21, and CS22. The cell strings CS11, CS12, CS21, and CS22 may be arranged along a row direction and a column direction to form rows and columns.

Each of the cell strings CS11, CS12, CS21, and CS22 may include a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In an exemplary embodiment, each of the memory cells included in the cell strings CS11, CS12, CS21, and CS22 is a charge trap flash (CTF) memory cell.

The plurality of memory cells MC1 to MC8 may be serially connected and may be stacked in a direction perpendicular to a plane defined by the row direction and the column direction, that is, in a height direction. In each cell string, the string selection transistors SSTa and SSTb may be serially connected and may be arranged between the memory cells MC1 to MC8 and the corresponding one of bit lines BL1 and BL2. The ground selection transistors GSTa and GSTb may be serially connected and may be disposed between the memory cells MC1 to MC8 and a common source line CSL.

In an exemplary embodiment, the first dummy memory cell DMC1 is disposed between the memory cells MC1 to MC8 and the ground selection transistors GSTa and GSTb. In an exemplary embodiment, the second dummy memory cell DMC2 is disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an exemplary embodiment, ground selection transistors in the same row are connected to the same ground selection line, and ground selection transistors in different rows are connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an exemplary embodiment, although not illustrated in FIG. 3, ground selection transistors provided at the same height from a substrate (not illustrated) may be connected to the same ground selection line, and ground selection transistors provided at different heights may be connected to different ground selection lines.

Memory cells of the same height from the substrate or the ground selection transistors GSTa and GSTb may be connected in common to the same word line, and memory cells of different heights therefrom may be connected to different word lines. For example, memory cells MC1 to MC8 of the cell strings CS11, CS12, CS21, and CS22 may be connected to first to eighth word lines WL1 to WL8.

First string selection transistors, which belong to the same row, from among the first string selection transistors SSTa at the same height may be connected to the same string selection line, and first string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, second string selection transistors, which belong to the same row, from among the second string selection transistors SSTb at the same height may be connected to the same string selection line, and second string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

In an exemplary embodiment, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

The memory block BLK illustrated in FIG. 3 is only an example. The number of cell strings may increase or decrease, and the number of rows of cell strings and the number of columns of cell strings may be increased or decreased depending on the number of cell strings. Also, in the memory block BLK, the number of cell transistors (GST, MC, DMC, SST, etc.) may be increased or decreased, and a height of the memory block BLK may be increased or decreased depending on the number of cell transistors. Also, the number of lines (GSL, WL, DWL, SSL, etc.) connected with transistors may increase or decrease depending on the number of the transistors.

Figure 4:
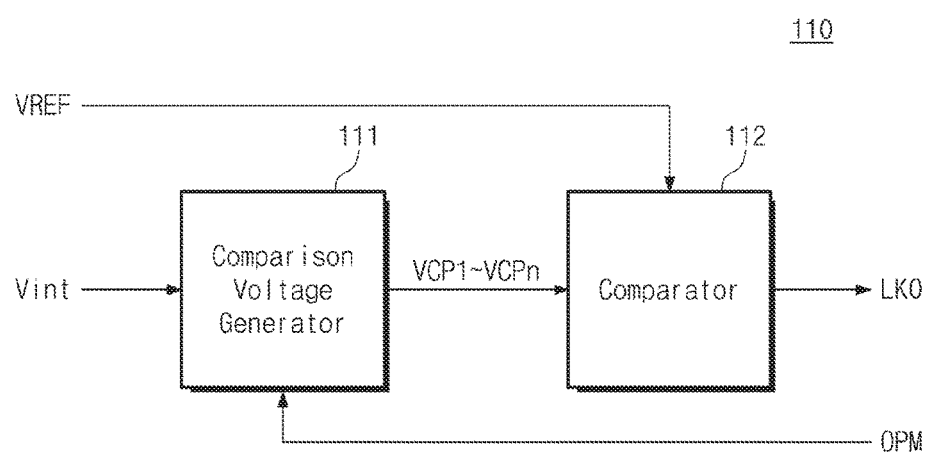
FIG. 4 is a block diagram illustrating a voltage drop detector of FIG. 2 according to an exemplary embodiment of the inventive concept.

FIG. 4 is a block diagram illustrating the voltage drop detector 110 of FIG. 2 according to an exemplary embodiment of the inventive concept. Referring to FIGS. 2 and 4, the voltage drop detector 110 includes a comparison voltage generator 111 and a comparator 112 (e.g., a comparator circuit).

The comparison voltage generator 111 may receive the internal voltage Vint and may receive the operation mode OPM from the control logic circuit 170. The comparison voltage generator 111 outputs comparison voltages VCP1 to VCPn or one thereof, based on the received operation mode OPM. In an exemplary embodiment, the comparison voltage generator 111 is a voltage divider that divides the internal voltage Vint to generate the comparison voltages VCP1 to VCPn or one thereof. The comparison voltage generator 111 may be configured to adjust a voltage division ratio based on the received operation mode OPM and to generate a comparison voltage corresponding to the operation mode OPM.

In an exemplary embodiment, the comparison voltages VCP1 to VCPn correspond to various operation modes OPM, respectively. For example, in the case where the comparison voltage generator 111 receives a first operation mode OPM1, the comparison voltage generator 111 outputs the first comparison voltage VCP1 corresponding to the first operation mode OPM1. Alternatively, in the case where the comparison voltage generator 111 receives a second operation mode OPM2, the comparison voltage generator 111 outputs the second comparison voltage VCP2 corresponding to the second operation mode OPM2. In an exemplary embodiment, as a current or a peak current that the nonvolatile memory device 100 uses under a specific operation mode increases, a level of the comparison voltage corresponding to the specific operation mode decreases.

The comparator 112 receives one of the comparison voltages VCP1 to VCPn from the comparison voltage generator 111 and compares the received comparison voltage with the reference voltage VREF. The comparator 112 outputs the lock-out signal LKO depending on the comparison result. For example, in the case where a received comparison voltage is lower than the reference voltage VREF, the comparator 112 outputs the lock-out signal LKO; in the case where a received comparison voltage is higher than or equal to the reference voltage VREF, the comparator 112 does not output the lock-out signal LKO.

Figure 5A:
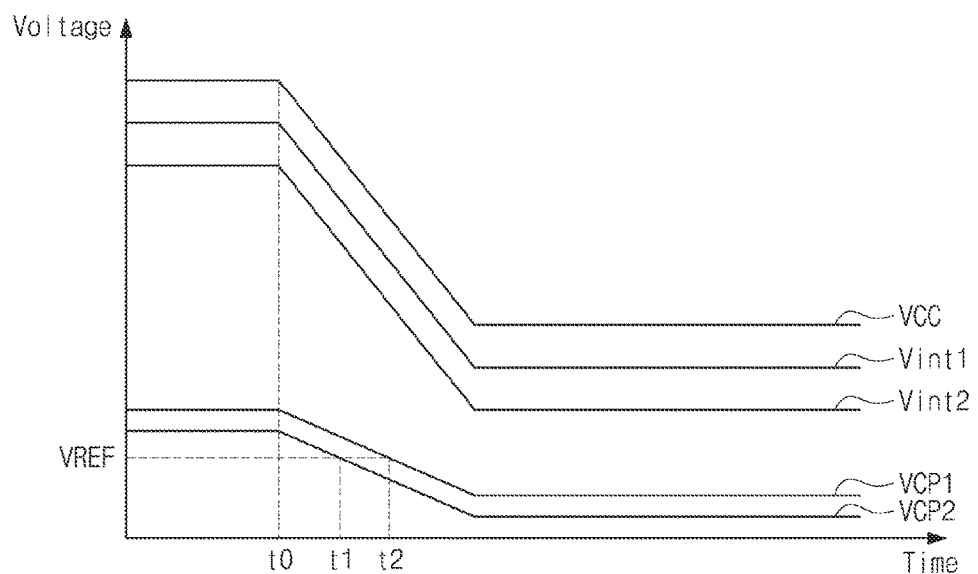
FIGS. 5A and 5B are graphs for describing a difference between output time points of a lock-out signal depending on whether the inventive concept is applied.
Figure 5B:
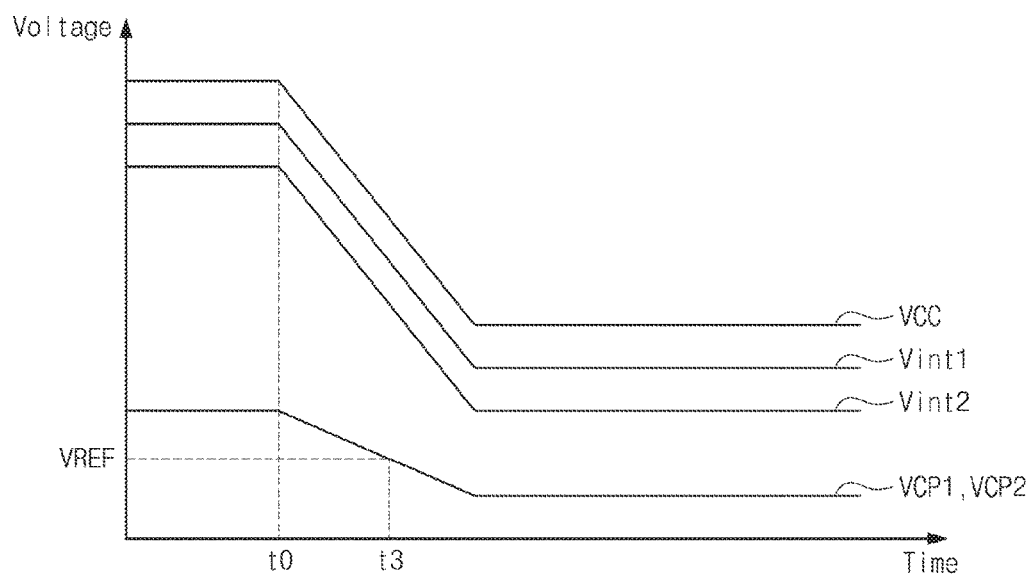

FIGS. 5A and 5B are graphs for describing a difference between output time points of the lock-out signal LKO depending on whether the inventive concept is applied. In an exemplary embodiment, in graphs of FIGS. 5A and 5B, X-axes denote a time, and Y-axes denote a voltage. Output time points of the lock-out signal LKO when the reference voltage VREF is fixed will be described with reference to FIG. 5A, and output time points of the lock-out signal LKO according to an exemplary embodiment of the inventive concept in which comparison voltages VCP1 and VCP2 generated based on the operation mode OPM are used will be described with reference to FIG. 5B.

For brevity of illustration, a first internal voltage Vint1 and a second internal voltage Vint2 generated in the first operation mode OPM1 and the second operation mode OPM2 are illustrated in FIGS. 5A and 5B. However, exemplary embodiments of the inventive concept are not limited thereto. For example, the nonvolatile memory device 100 may operate depending on a plurality of operation modes, and the internal voltage Vint may be variously changed depending on the operation modes.

In an exemplary embodiment, the current or peak current that the nonvolatile memory device 100 uses in the first operation mode OPM1 is smaller than the current or peak current that the nonvolatile memory device 100 uses in the second operation mode OPM2. Accordingly, even though the same power supply voltage VCC is applied, the first internal voltage Vint1 in the first operation mode OPM1 is higher than the second internal voltage Vint2 in the second operation mode OPM2.

First, referring to FIGS. 4 and 5A, the power supply voltage VCC starts to decrease at a 0-th time point t0. As the power supply voltage VCC decreases, the first and second internal voltages Vint1 and Vint2 decrease. If the first and second internal voltages Vint1 and Vint2 decrease, the first and second comparison voltages VCP1 and VCP2 based on the first and second internal voltages Vint1 and Vint2 decrease. In an example embodiment, the first and second comparison voltages VCP1 and VCP2 illustrated in FIG. 5A are voltages that are not compensated for or not adjusted depending on the operation mode OPM.

The second comparison voltage VCP2 is lower than the reference voltage VREF at a first time point t1. That is, in the case where compensation associated with the operation mode OPM is not performed with respect to comparison voltages, in the second operation mode OPM2, the lock-out signal LKO is output at the first time point t1. In an embodiment, the nonvolatile memory device 100 that operates in the second operation mode OPM2 starts the recovery operation at the first time point t1 in response to the lock-out signal LKO.

In contrast, the first comparison voltage VCP1 is lower than the reference voltage VREF at a second time point t2. That is, in the case where compensation associated with the operation mode OPM is not performed with respect to comparison voltages, in the first operation mode OPM1, the lock-out signal LKO is output at the second time point t2. In other words, the nonvolatile memory device 100 that operates in the first operation mode OPM1 may start the recovery operation at the second time point t2.

As illustrated in FIG. 5A, the second time point t2 is later than the first time point t1. In other words, in the case where compensation associated with the operation mode OPM is not performed with respect to comparison voltages, even though the same power supply voltage VCC is applied, an output time point of the lock-out signal LKO may vary depending on an operation mode. In the case where the lock-out signal LKO is output at the second time point t2, a sufficient margin for the recovery operation is not secured. Alternatively, in the case where the lock-out signal LKO is output at the first time point t1, an unnecessary recovery operation may be performed.

Referring to FIGS. 4 and 5B, the comparison voltage generator 111 of the voltage drop detector 110 generates the first comparison voltage VCP1 with regard to the first operation mode OPM1 and generates the second comparison voltage VCP2 with regard to the second operation mode OPM2. In this case, as illustrated in FIG. 5B, even though the first and second internal voltages Vint1 and Vint2 are different from each other, since compensation is performed with respect to the first and second comparison voltages VCP1 and VCP2 depending on an operation mode, the first and second comparison voltages VCP1 and VCP2 have the same or substantially the same level.

That is, as illustrated in FIG. 5B, even though the first and second internal voltages Vint1 and Vint2 are different from each other due to a difference between operations modes, since the first and second comparison voltages VCP1 and VCP2 have the same level or substantially same level, the first and second comparison voltages VCP1 and VCP2 are lower than the reference voltage VREF at the same time point (e.g., a third time point t3). As such, even though an operation mode of the nonvolatile memory device 100 is changed, the lock-out signal LKO is output at the same time point (e.g., the third time point t3).

That is, unlike the above description referencing FIG. 5A, even though the nonvolatile memory device 100 operates depending on a different operation mode OPM, it may be possible to secure a sufficient operation margin of the recovery operation to be performed in response to the lock-out signal LKO or to prevent an unnecessary recovery operation.

Figure 6A:
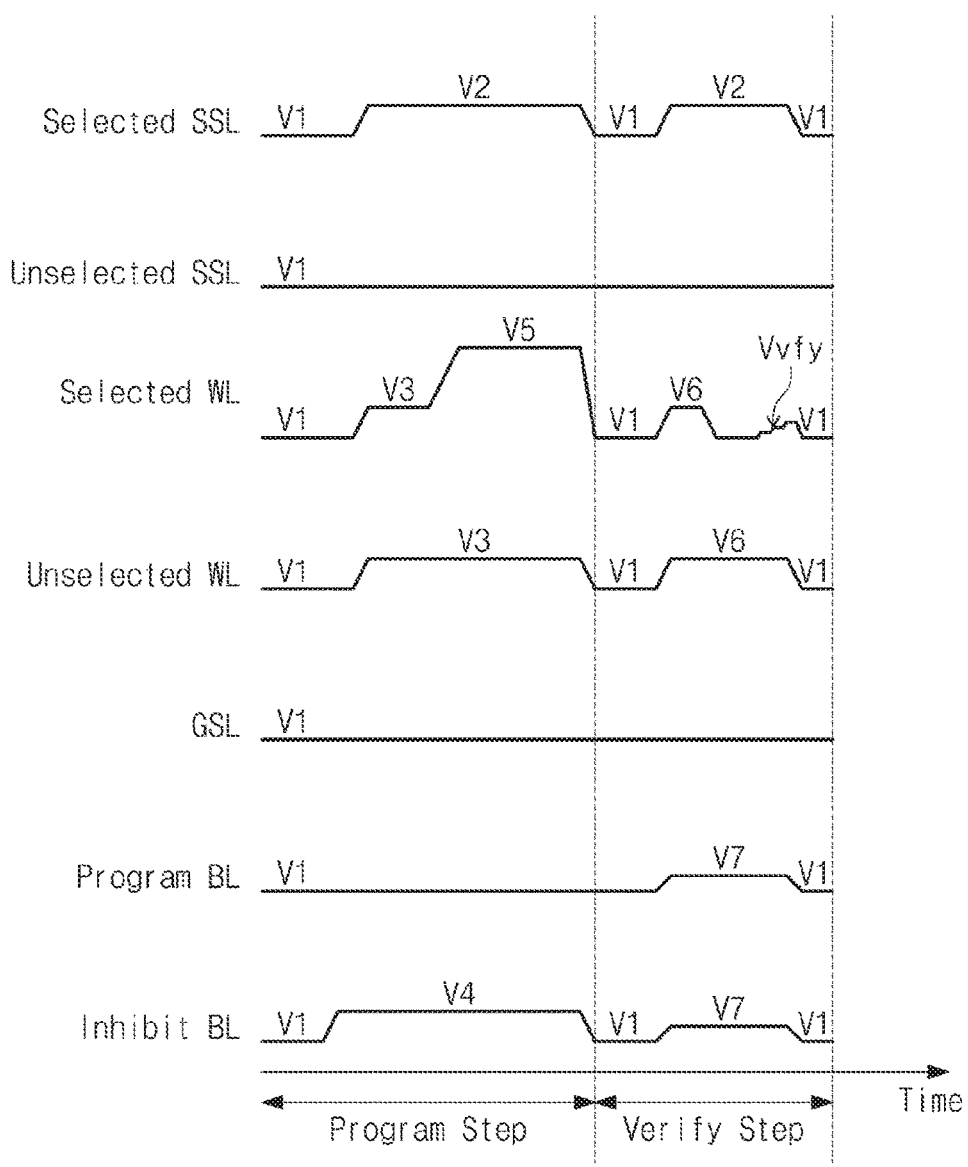
FIGS. 6A and 6B are timing diagrams illustrating a program operation of the nonvolatile memory device of FIG. 2.
Figure 6B:
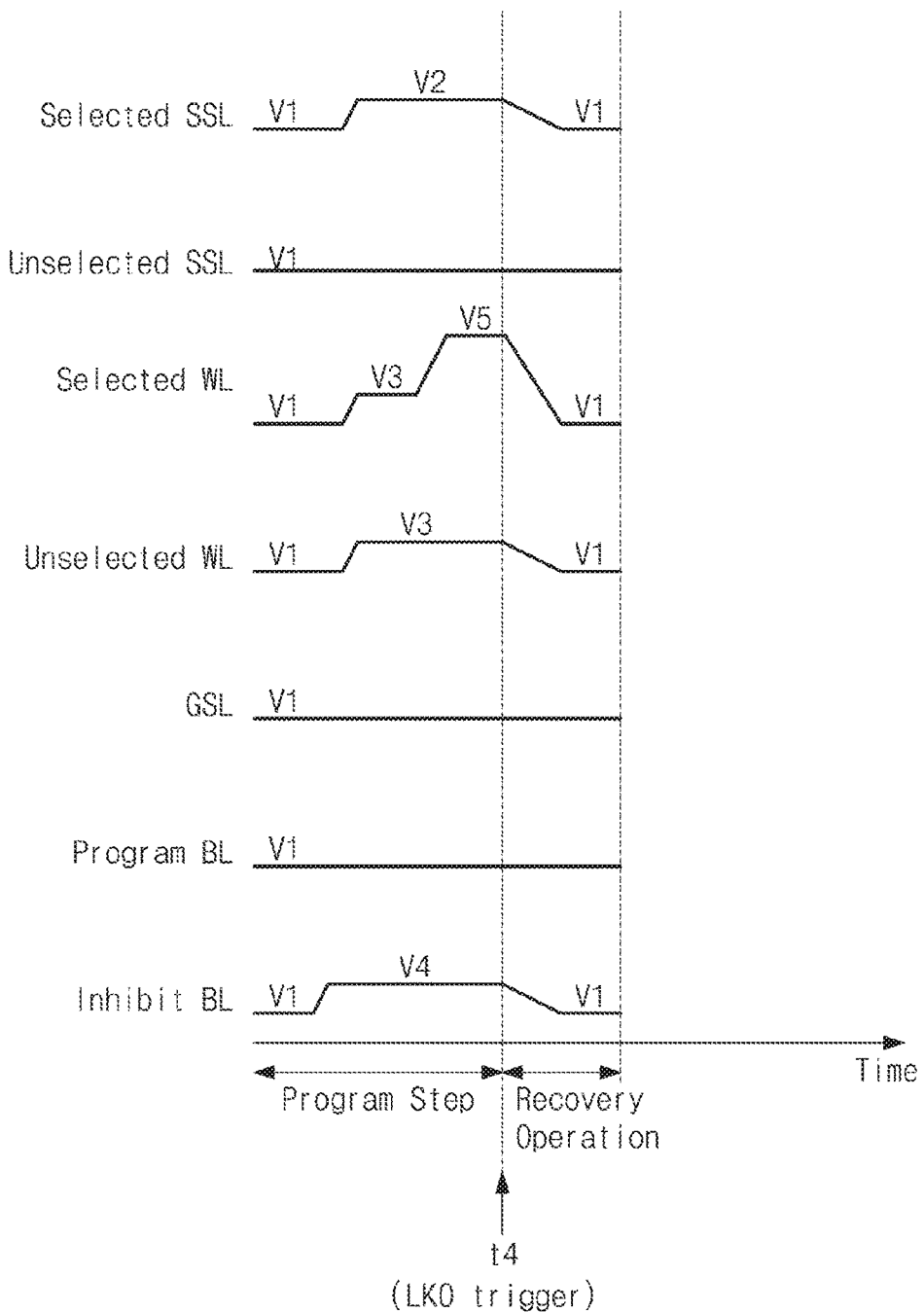

FIGS. 6A and 6B are timing diagrams illustrating a program operation of the nonvolatile memory device 100 of FIG. 2. In the timing diagrams of FIGS. 6A and 6B, X-axes denote a time, and Y-axes denote a level of a voltage applied to each line. In an exemplary embodiment, a program operation of the nonvolatile memory device 100 will be described with reference to FIG. 6A. Also, a recovery operation of the nonvolatile memory device 100 to be performed in response to the lock-out signal LKO will be described with reference to FIG. 6B. In an embodiment, the recovery operation causes the discharging of voltages that were previously applied to a portion of the nonvolatile memory device during a programming of the portion, so that a next operation can be performed on the portion. The recovery operation may be used to discharge a current or a voltage bias provided to memory cells selected for access.

The timing diagrams illustrated in FIGS. 6A and 6B are used to show exemplary operations of the nonvolatile memory device 100. However, exemplary embodiments of the inventive concept are not limited thereto. For example, the nonvolatile memory device 100 may perform various program operations or various recovery operations.

First, referring to FIGS. 2 and 6A, the nonvolatile memory device 100 performs a program operation in response to a command CMD (in particular, a program command) from the memory controller 11 as illustrated in FIG. 6A. In an exemplary embodiment, the program operation illustrated in FIG. 6A shows one program loop including one program step and one verify step. However, exemplary embodiments of the inventive concept are not limited thereto. For example, the nonvolatile memory device 100 may perform a plurality of program loops using an incremental step pulse programming (ISPP) scheme.

In the program step, voltage levels of a selected string selection line (SSL), an unselected string selection line, a selected word line (WL), an unselected word line, a ground select line (GSL), a program bit line (BL), an inhibit bit line (BL) are "V1" (hereinafter referred to as a "first voltage V1") initially. In an exemplary embodiment, the first voltage V1 is a ground voltage GND. In an alternate embodiment, the first voltage V1 is a positive voltage or a negative voltage.

Afterwards in the program step, to prevent a memory cell connected with the inhibit bit lines and the selected word line from being programmed, the voltage level of the inhibit bit line is increased to "V4" (hereinafter referred to as a "fourth voltage V4"). In an exemplary embodiment, the fourth voltage V4 is the power supply voltage VCC.

Afterwards in the program step, the voltage level of the selected string selection line increases to "V2" (hereinafter referred to as a "second voltage V2"), and the voltage levels of the selected word line and the unselected word line increase to "V3" (hereinafter referred to as a "third voltage V3"). In an exemplary embodiment, the second voltage V2 is the power supply voltage VCC, and the third voltage V3 is a voltage (e.g., a turn-on voltage) that is high enough to turn on memory cells connected with the selected word line and the unselected word line.

Afterwards in the program step, the voltage level of the selected word line increases to "V5" (hereinafter referred to as a "fifth voltage V5"). In an exemplary embodiment, the fifth voltage V5 is a program voltage for programming memory cells connected with the selected word line. When the voltage level of the selected word line increases to the fifth voltage V5, memory cells connected with the selected word line and the program bit lines are programmed.

Afterwards in the program step, the voltage levels of the selected string selection line, the selected word line, the unselected word line, and the inhibit bit line decrease to "V1". One program step may be performed depending on the above-described voltage control.

Next in the verify step, the voltage level of the selected string selection line increases from V1 to V2, the voltage levels of the selected word line and the unselected word line increase from V1 to "V6" (hereinafter referred to as a "sixth voltage V6"), and the voltage levels of the program bit line and the inhibit bit line increase from V1 to "V7" (hereinafter referred to as a "seventh voltage V7"). In an exemplary embodiment, the sixth voltage V6 is a turn-on voltage for turning on memory cells, and the seventh voltage V7 is a precharge voltage.

After the voltage level of the selected word line decreases from V6 to V1 in the verify step, a verification voltage Vvfy is applied to the selected word line. When the verification voltage Vvfy is applied to the selected word line in the verify step, program states of memory cells connected with the selected word line may be verified. In an exemplary embodiment, the verification voltage Vvfy is variously changed or modified depending on data to be programmed in memory cells connected with the selected word line or depending on a program manner.

After the verification voltage Vvfy is applied in the verify step to the selected word line, the voltage levels of the selected string selection line, the selected word line, the unselected word line, the program bit line, and the inhibit bit line decrease to "V1".

In an exemplary embodiment, one verify step may be performed depending on the above-described voltage control. In an exemplary embodiment, in the verify step, a pre-pulse interval during which the sixth voltage V6 is applied to the selected word line may be omitted in some operations.

As described above, the nonvolatile memory device 100 may perform the program operation by repeatedly performing the exemplary program loop illustrated in FIG. 6A. In an exemplary embodiment, each time the program loop is repeated, the fifth voltage V5 (i.e., a program voltage) applied to the selected word line is gradually increased.

Referring to FIG. 6B, the nonvolatile memory device 100 performs the program loop as described with reference to FIG. 6A. In this case, at a fourth time point t4 illustrated in FIG. 6B, the lock-out signal LKO is output from the voltage drop detector 110. In other words, at the fourth time point t4, the comparison voltage VCP is lower than the reference voltage VREF. Here, the comparison voltage VCP may be a voltage that is adjusted depending on the operation mode OPM (corresponding to a program mode) of the nonvolatile memory device 100.

In an embodiment, the nonvolatile memory device 100 suspends a program loop being performed at the fourth time point t4 when the lock-out signal LKO is generated and then performs the recovery operation. For example, the nonvolatile memory device 100 may discharge or decrease voltage levels of the selected string selection line, the unselected string selection line, the selected word line, the unselected word line, the ground selection line, the program bit line, and the inhibit bit lines to the first voltage V1 during the recovery operation. The recovery operation may be performed to secure the reliability of data, which are stored in programmed memory cells whose programming previously completed, from among memory cells connected with the selected word line or to prevent various disturbances due to a voltage drop of the internal voltage Vint.

For example, in the case where the comparison voltage VCP is lower than the reference voltage VREF, the inhibit bit line is not charged with the fourth voltage V4 (i.e., the power supply voltage VCC). In this case, memory cells (i.e., memory cells whose programming completed) connected with the inhibit bit line may be programmed, thereby reducing the reliability of data. To prevent the issue, the nonvolatile memory device 100 may suspend the program operation in response to the lock-out signal LKO and may perform the recovery operation as described above. As the recovery operation is performed, the reliability of data stored in the memory cells whose programming completed may be secured.

The recovery operation is not limited to that which is illustrated in FIG. 6B. For example, in a program operation, a read operation, or an erase operation, the recovery operation may include various operations for securing the reliability of stored data. Also, the recovery operation may include a reset operation of the nonvolatile memory device 100. In an embodiment, the reset operation causes the cessation of reading or writing to a memory cell.

Figure 7:
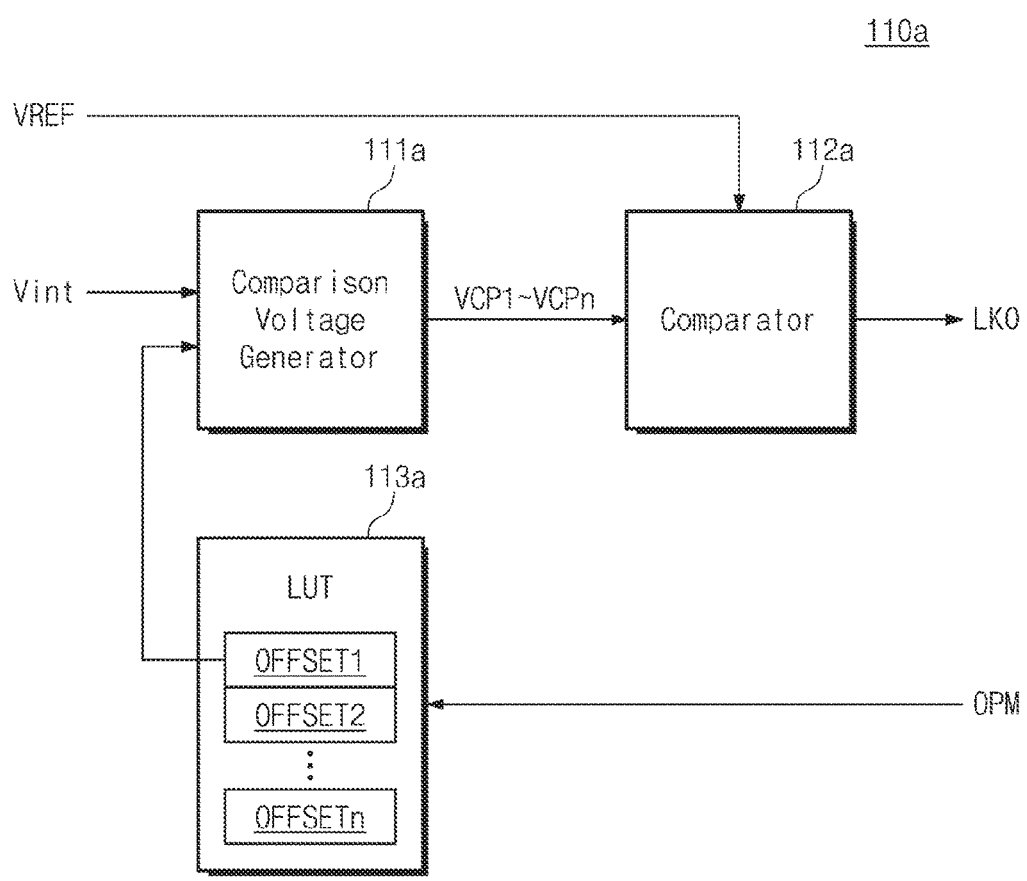
FIG. 7 is a block diagram illustrating the voltage drop detector of FIG. 2 according to an exemplary embodiment of the inventive concept.

FIG. 7 is a block diagram illustrating the voltage drop detector of FIG. 2 according to an exemplary embodiment of the inventive concept. Referring to FIGS. 2 and 7, a voltage drop detector 110a includes a comparison voltage generator 111a, a comparator 112a, and a lookup table 113a. The comparison voltage generator 111a may be implemented by the comparison voltage generator 111 of FIG. 4. The comparator 112a may be implemented by the comparator 112 of FIG. 4.

The lookup table 113a includes a plurality of offsets OFFSET1 to OFFSETn. The plurality of offsets OFFSET1 to OFFSETn respectively correspond to the comparison voltages VCP1 to VCPn corresponding to a plurality of operation modes OPM. In an embodiment, each offset is a difference between the corresponding comparison voltage and the reference voltage VREF. In an alternate embodiment, each offset is a voltage division ratio of the comparison voltage generator 111a associated with the corresponding operation mode OPM. One of the plurality of offsets OFFSET1 to OFFSETn included in the lookup table 113a is selected based on the operation mode OPM received from the control logic circuit 170, and the selected offset is provided to the comparison voltage generator 111a. In an exemplary embodiment, the lookup table 113a is created during the process of manufacturing the nonvolatile memory device 100. The lookup table 113a may be updated while the nonvolatile memory device 100 is being driven. In an exemplary embodiment, the lookup table 113a is implemented with a storage circuit such as a register circuit or a fuse circuit.

The comparison voltage generator 111a receives the internal voltage Vint and receives an offset (assumed to be the first offset OFFSET1) corresponding to the operation mode OPM from the lookup table 113a. In an embodiment, the comparison voltage generator 111a adjusts the internal voltage Vint by as much as the received offset OFFSET1 to output one of the plurality of comparison voltages VCP1 to VCPn. In an embodiment, the comparison voltage generator 111a adjusts a voltage division ratio based on the received offset OFFSET1 and divides the internal voltage Vint based on the adjusted voltage division ratio to output one of the plurality of comparison voltages VCP1 to VCPn.

As described above, the voltage drop detector 110a includes the plurality of offsets OFFSET1 to OFFSETn respectively corresponding to the plurality of operation modes OPM and generates a comparison voltage corresponding to the operation mode OPM from the control logic circuit 170 based on the plurality of offsets OFFSET1 to OFFSETn.

Figure 8:
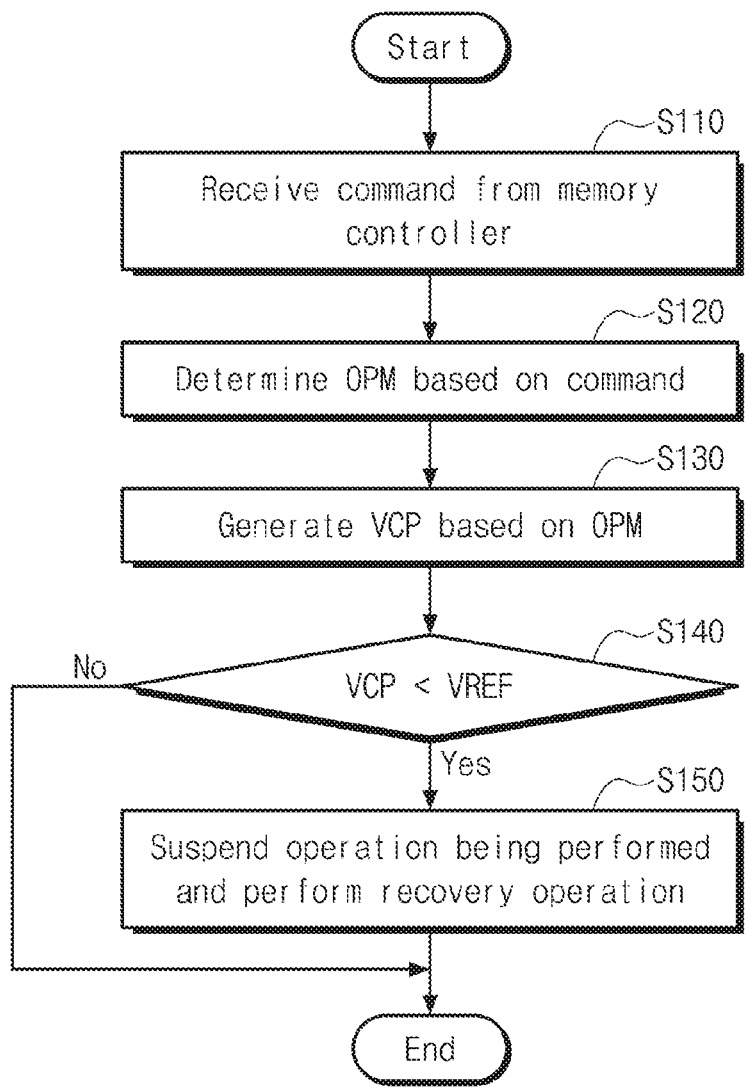
FIG. 8 is a flowchart illustrating an operation of the nonvolatile memory system of FIG. 2 according to an exemplary embodiment of the inventive concept.

FIG. 8 is a flowchart illustrating an operation of the nonvolatile memory device 100 of FIG. 2. Referring to FIGS. 2 and 8, in operation S110, the nonvolatile memory device 100 receives the command CMD from the memory controller 11.

In operation S120, the nonvolatile memory device 100 determines the operation mode OPM based on the received command CMD.

In operation S130, the nonvolatile memory device 100 generates the comparison voltage VCP based on the determined operation mode OPM. For example, the voltage drop detector 110 of the nonvolatile memory device 100 may adjust a voltage division ratio based on the operation mode OPM received from the control logic circuit 170 and may divide the internal voltage Vint based on the adjusted voltage division ratio to generate the comparison voltage VCP. In an exemplary embodiment, the comparison voltage VCP is a comparison target voltage to be compared with the reference voltage VREF for the purpose of detecting a voltage drop.

In operation S140, the nonvolatile memory device 100 determines whether the comparison voltage VCP is lower than the reference voltage VREF. For example, the voltage drop detector 110 of the nonvolatile memory device 100 may determine whether the comparison voltage VCP is lower than the reference voltage VREF.

If the comparison voltage VCP is lower than the reference voltage VREF, in operation S150, the nonvolatile memory device 100 suspends an operation being performed and performs the recovery operation. For example, in the case where the comparison voltage VCP is lower than the reference voltage VREF, the voltage drop detector 110 outputs the lock-out signal LKO. The control logic circuit 170 may suspend an operation being performed in response to the lock-out signal LKO and may perform the recovery operation. For example, the operation being performed can be a programming operation.

In the case where the comparison voltage VCP is not lower than the reference voltage VREF, the nonvolatile memory device 100 does not perform a separate operation or continues a current operation being performed.

In an exemplary embodiment, in the case where the comparison voltage VCP is not lower than the reference voltage VREF, the nonvolatile memory device 100 continuously monitors the internal voltage Vint to generate the comparison voltage VCP based on the operation mode OPM and compares the generated comparison voltage VCP with the reference voltage VREF. In an exemplary embodiment, in the case where an operation mode of the nonvolatile memory device 100 is changed (e.g., in the case where a new command CMD is received), the voltage drop detector 110 generates a new comparison voltage VCP.

Figure 9:
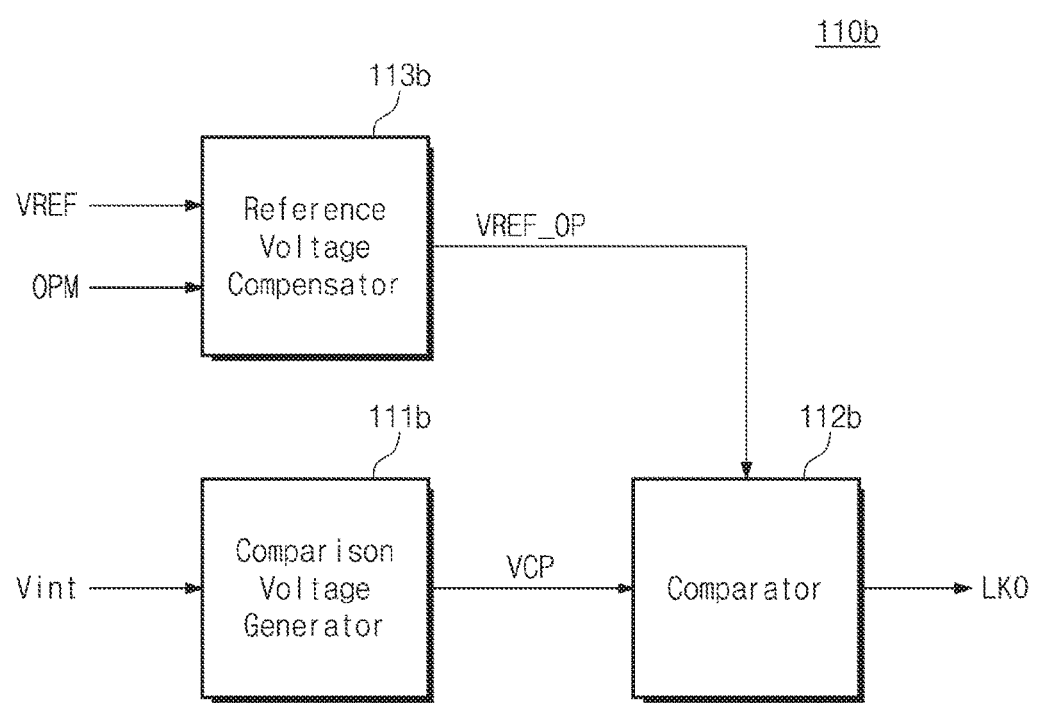
FIG. 9 is a block diagram illustrating the voltage drop detector of FIG. 2 according to an exemplary embodiment of the inventive concept.
Figure 10:
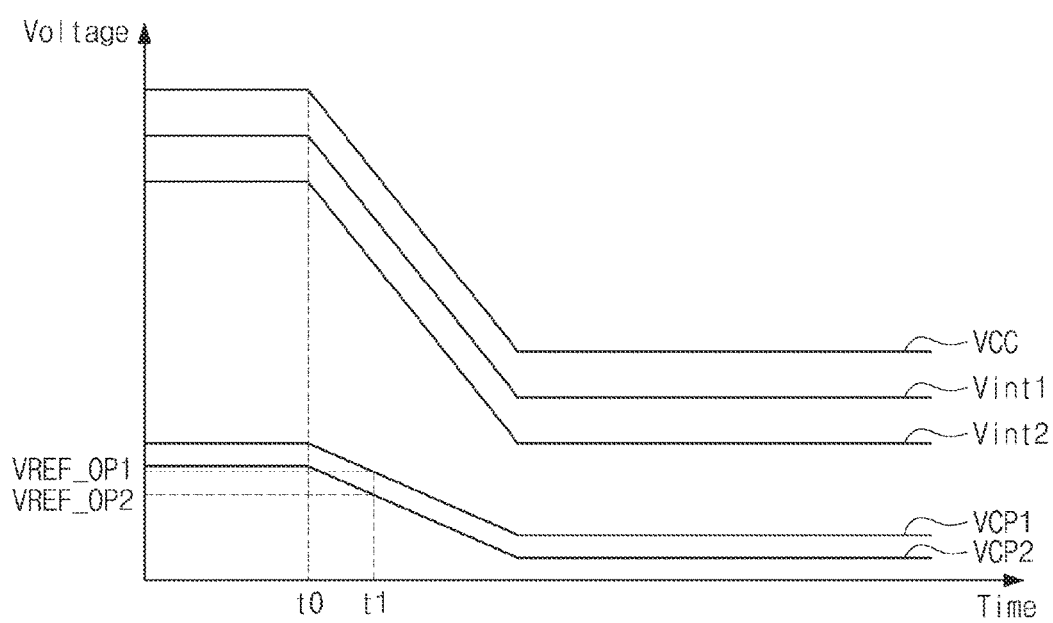
FIG. 10 is a graph for describing an operation of the voltage drop detector of FIG. 9.

FIG. 9 is a block diagram illustrating the voltage drop detector of FIG. 2 according to an exemplary embodiment of the inventive concept. FIG. 10 is a graph for describing an operation of a voltage drop detector of FIG. 9. In FIG. 10, an X-axis denotes a time, and a Y-axis denotes a voltage. Referring to FIGS. 2, 9, and 10, a voltage drop detector 110b includes a comparison voltage generator 111b, a comparator 112b, and a reference voltage compensator 113b. The comparison voltage generator 110b may be implemented by the comparison voltage generator 111 of FIG. 4. The comparator 112b may be implemented by the comparator 112 of FIG. 4.

The comparison voltage generator 111b generates the comparison voltage VCP based on the operation mode OPM in a similar manner to the comparison voltage generator 111 described above. However, in an exemplary embodiment of FIG. 9, the comparison voltage generator 111b generates the comparison voltage VCP based on a preset voltage division ratio. That is, in the exemplary embodiment of FIG. 9, a level of the comparison voltage VCP varies depending on an operation mode of the nonvolatile memory device 100 as described with reference to FIG. 5A.

Different from the voltage drop detector of FIG. 7, in the exemplary embodiment of FIG. 9, the voltage drop detector 110b includes the reference voltage compensator 113b. The reference voltage compensator 113b compensates for the reference voltage VREF based on the operation mode OPM to generate a compensation reference voltage VREF_OP. That is, a value of the compensation reference voltage VREF_OP may vary depending on the operation mode OPM of the nonvolatile memory device 100. For example, the reference voltage compensator 113b may adjust the reference voltage VREF based on the operation mode OPM to generate the compensation reference voltage VREF_OP.

In an exemplary embodiment, a time point when the lock-out signal LKO is output is maintained uniformly by compensating for the reference voltage VREF depending on the operation mode OPM. For example, as illustrated in FIG. 10, the power supply voltage VCC starts to decrease at a 0-th time point t0, and thus, the first and second internal voltages Vint1 and Vint2 and the first and second comparison voltages VCP1 and VCP2 start to decrease. As described with reference to FIG. 5A, the first and second internal voltages Vint1 and Vint2 and the first and second comparison voltages VCP1 and VCP2 that are voltages associated with different operation modes (e.g., the first and second operation modes OPM1 and OPM2) have different levels.

The voltage drop detector 110b of FIG. 9 may generate compensation reference voltages VREF_OP1 and VREF_OP2 based on the operation mode OPM. For example, the reference voltage compensator 113b may generate the first compensation reference voltage VREF_OP1 corresponding to the first operation mode OPM1 and may generate the second compensation reference voltage VREF_OP2 corresponding to the second operation mode OPM2. In this case, the first and second compensation reference voltages VREF_OP1 and VREF_OP2 have different values depending on an operation mode.

As illustrated in FIG. 10, even though the first and second comparison voltages VCP1 and VCP2 associated with the first and second operation modes OPM1 and OPM2 are different from each other, a time point when the lock-out signal LKO is output (e.g., the first time point t1) may be identically maintained by compensating for the reference voltage VREF based on the operation mode OPM.

In other words, the voltage drop detector 110b may compensate for the reference voltage VREF based on the operation mode OPM, thereby securing a margin of the recovery operation or preventing an unnecessary recovery operation.

Figure 11:
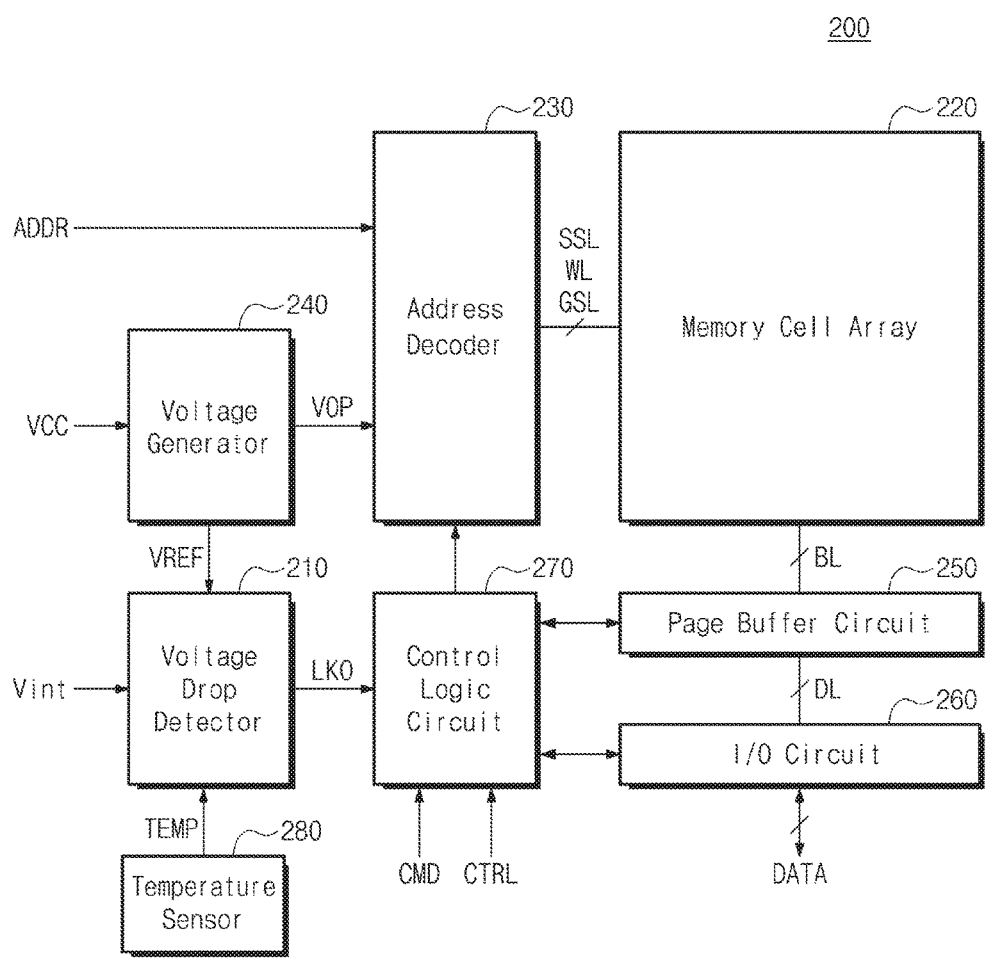
FIG. 11 is a block diagram illustrating the nonvolatile memory device according to an exemplary embodiment of the inventive concept.

FIG. 11 is a block diagram illustrating a nonvolatile memory device 200 according to an exemplary embodiment of the inventive concept. Referring to FIG. 11, the nonvolatile memory device 200 includes a voltage drop detector 210, a memory cell array 220, an address decoder 230, a voltage generator 240, a page buffer circuit 250, an input/output circuit 260, a control logic circuit 270, and a temperature sensor 280.

The nonvolatile memory device 200 of FIG. 11 further includes the temperature sensor 280 as compared with the nonvolatile memory device 100 of FIG. 2. The temperature sensor 280 measures an operation temperature (or a current temperature) of the nonvolatile memory device 200 and provides information TEMP indicating the measured temperature to the voltage drop detector 210.

Figure 12:
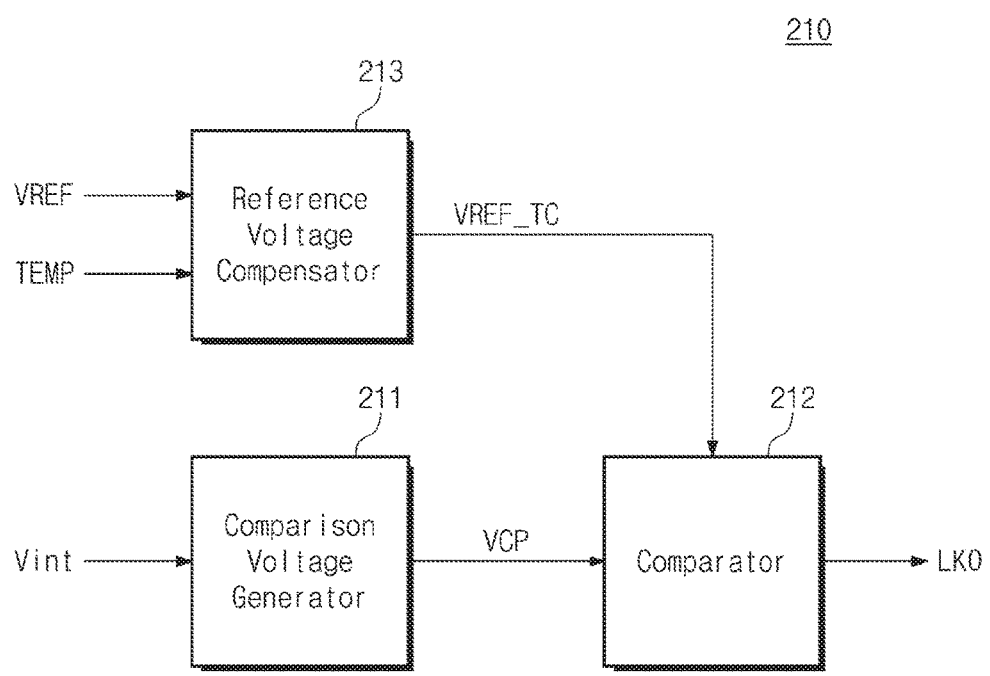
FIG. 12 is a block diagram illustrating the voltage drop detector of FIG. 11 according to an exemplary embodiment of the inventive concept.

The voltage drop detector 210 may compensate for the reference voltage VREF based on the received temperature information TEMP to generate the temperature compensation reference voltage VREF_TC (refer to FIG. 12). The voltage drop detector 210 may compare the comparison voltage VCP based on the internal voltage Vint with the temperature compensation reference voltage VREF_TC to output the lock-out signal LKO depending on the comparison result.

For example, the reference voltage VREF output from the voltage generator 240 may vary depending on an operation temperature of the nonvolatile memory device 200. In this case, even though the same power supply voltage VCC is applied, since the reference voltage VREF varies depending on an operation temperature, a time point when the lock-out signal LKO is output may vary depending on the operation temperature. The voltage drop detector 210 according to the inventive concept compensates for the reference voltage VREF based on the temperature information TEMP from the temperature sensor 280, thus generating a substantially uniform temperature compensation reference voltage VREF_TC regardless of temperature. Since the voltage drop detector 210 uses the temperature compensation reference voltage VREF_TC as a comparison reference, the voltage drop detector 210 may output the lock-out signal LKO with respect to the same power supply voltage VCC at a uniform time point regardless of temperature. Accordingly, it may be possible to secure a margin for the recovery operation of the nonvolatile memory device 200 or to prevent an unnecessary recovery operation.

FIG. 12 is a block diagram illustrating the voltage drop detector 210 of FIG. 11 according to an exemplary embodiment of the inventive concept. Referring to FIGS. 11 and 12, the voltage drop detector 210 includes a comparison voltage generator 211, a comparator 212, and a reference voltage compensator 213. The comparison voltage generator 211 and the comparator 212 are described with reference to FIG. 9, and a description thereof will not be repeated here.

The reference voltage compensator 213 may receive the reference voltage VREF from the voltage generator 240 and may receive the temperature information TEMP from the temperature sensor 280. In an embodiment, the reference voltage compensator 213 adjusts the reference voltage VREF based on the received temperature information TEMP to generate the temperature compensation reference voltage VREF_TC. In an exemplary embodiment, the temperature compensation reference voltage VREF_TC has a uniform voltage level regardless of an operation temperature of the nonvolatile memory device 200. The reference voltage compensator 213 provides the temperature compensation reference voltage VREF_TC to the comparator 212.

The comparator 212 compares the comparison voltage VCP from the comparison voltage generator 211 with the temperature compensation reference voltage VREF_TC and may output the lock-out signal LKO depending on the comparison result.

Figure 13:
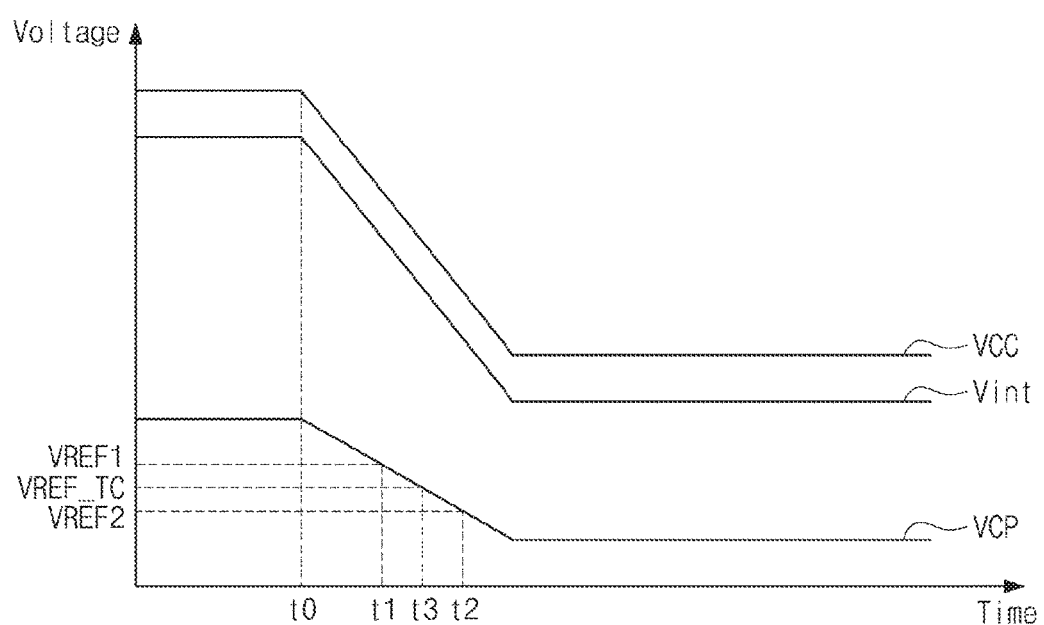
FIG. 13 is a graph for describing an operation of the voltage drop detector of FIG. 12.

FIG. 13 is a graph for describing an operation of a voltage drop detector of FIG. 12. In FIG. 13, an X-axis denotes a time, and a Y-axis denotes a voltage. In an exemplary embodiment, it is assumed that a first reference voltage VREF1 is a reference voltage output from the voltage generator 240 when an operation temperature of the nonvolatile memory device 200 is a first value. In an exemplary embodiment, it is assumed that a second reference voltage VREF2 is a reference voltage output from the voltage generator 240 when an operation temperature of the nonvolatile memory device 200 is a second value different from the first value. That is, a reference voltage output from the voltage generator 240 may vary depending on temperature.

Referring to FIGS. 11 to 13, the power supply voltage VCC starts to decrease at a 0-th time point t0, and thus, the internal voltage Vint and the comparison voltage VCP decrease. At a first time point t1, the comparison voltage VCP is lower than the first reference voltage VREF1. That is, in the case where an operation temperature of the nonvolatile memory device 200 is the first value, the lock-out signal LKO is output at the first time point t1, and the recovery operation may be performed in response to the lock-out signal LKO.

In contrast, at a second time point t2, the comparison voltage VCP is lower than the second reference voltage VREF2. That is, in the case where an operation temperature of the nonvolatile memory device 200 is a second value, the lock-out signal LKO is output at the second time point t2, and the recovery operation may be performed in response to the lock-out signal LKO.

As described above, since the reference voltage VREF varies depending on the operation temperature of the nonvolatile memory device 200, a time point when the recovery operation starts may vary. In this case, an operation margin for the recovery operation may not be secured sufficiently, or an unnecessary recovery operation may be performed.

The voltage drop detector 210 according to the inventive concept may adjust the reference voltage VREF based on the temperature information TEMP to generate the temperature compensation reference voltage VREF_TC. The temperature compensation reference voltage VREF_TC may have a uniform voltage level regardless of temperature. For example, in the case where an operation temperature of the nonvolatile memory device 200 is the first value, a reference voltage provided from the voltage generator 240 may be the first reference voltage VREF1. In this case, the voltage drop detector 210 may compensate for the first reference voltage VREF1 based on the temperature information TEMP representing the first value, to generate the temperature compensation reference voltage VREF_TC. Alternatively, in the case where an operation temperature of the nonvolatile memory device 200 is the second value, a reference voltage provided from the voltage generator 240 may be the second reference voltage VREF2. In this case, the voltage drop detector 210 may compensate for the second reference voltage VREF2 based on the temperature information TEMP representing the second value, to generate the temperature compensation reference voltage VREF_TC.

As illustrated in FIG. 13, in the case where the temperature compensation reference voltage VREF_TC is used as a comparison reference, the lock-out signal LKO may be output at a uniform time point (i.e., the third time point t3) regardless of temperature. Accordingly, an operation margin for the recovery operation may be secured sufficiently, or an unnecessary recovery operation may be prevented.

Figure 14:
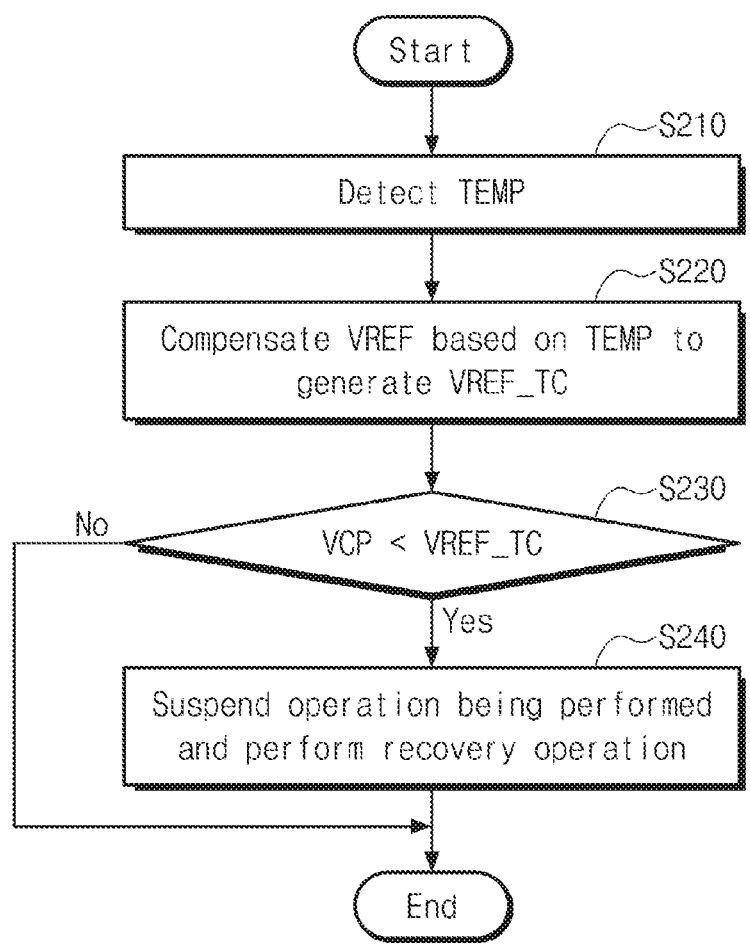
FIG. 14 is a flowchart illustrating an operation of the nonvolatile memory device of FIG. 11 according to an exemplary embodiment of the inventive concept.

FIG. 14 is a flowchart illustrating an operation of a nonvolatile memory device of FIG. 11. Referring to FIGS. 11 and 14, in operation S210, the nonvolatile memory device 200 detects an operation temperature (or the temperature information TEMP).

In operation S220, the nonvolatile memory device 200 generates the temperature compensation reference voltage VREF_TC based on the temperature information TEMP.

Operation S230 and operation S240 may be similar to operation S140 and operation S150 of FIG. 8, and a detailed description thereof will not be repeated here.

As described above, the voltage drop detector 210 generates the temperature compensation reference voltage VREF_TC based on the temperature information TEMP, thereby making it possible to secure a sufficient operation margin of the recovery operation regardless of temperature and preventing the recovery operation from being unnecessarily performed.

Figure 15:
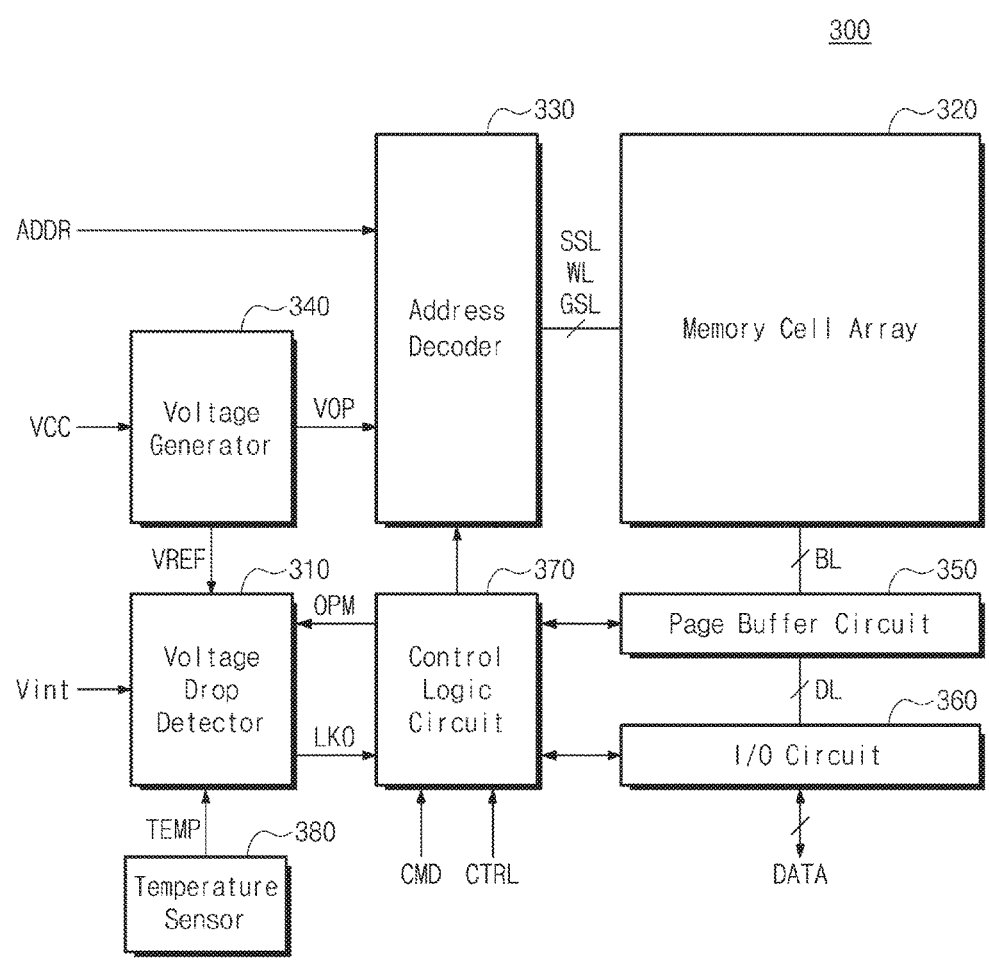
FIG. 15 is a block diagram illustrating the nonvolatile memory device according to an exemplary embodiment of the inventive concept.
Figure 16:
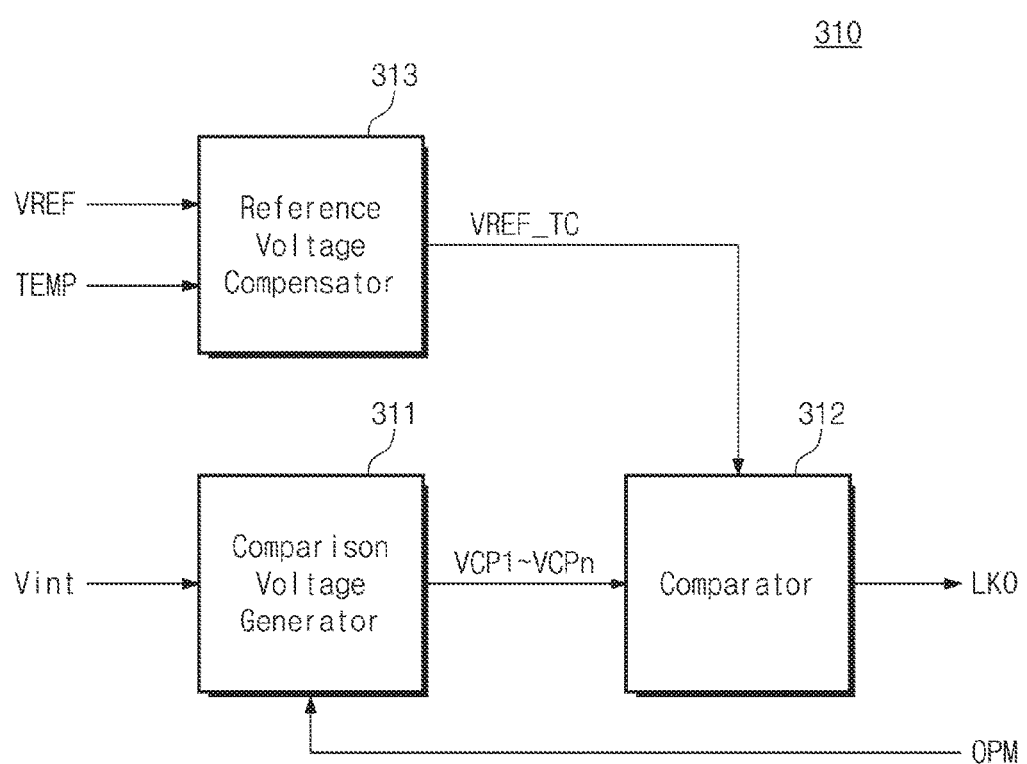
FIG. 16 is a block diagram illustrating the voltage drop detector of FIG. 15 according to an exemplary embodiment of the inventive concept.

FIG. 15 is a block diagram illustrating a nonvolatile memory device 300 according to an exemplary embodiment of the inventive concept. FIG. 16 is a block diagram illustrating a voltage drop detector 310 of FIG. 15 according to an exemplary embodiment of the inventive concept. Referring to FIGS. 15 and 16, the nonvolatile memory device 300 includes the voltage drop detector 310, a memory cell array 320, an address decoder 330, a voltage generator 340, a page buffer circuit 350, an input/output circuit 360, a control logic circuit 370, and a temperature sensor 380.

The voltage drop detector 310 receives the operation mode OPM from the control logic circuit 370 and receives the temperature information TEMP from the temperature sensor 380. The voltage drop detector 310 may generate the temperature compensation reference voltage VREF_TC based on the temperature information TEMP and may generate the comparison voltage VCP based on the operation mode OPM. In an exemplary embodiment, the temperature compensation reference voltage VREF_TC is generated based on the exemplary embodiment described with reference to FIGS. 11 to 13, and the comparison voltage VCP is generated based on the exemplary embodiments described with reference to FIGS. 1 to 8.

For example, as illustrated in FIG. 16, the voltage drop detector 310 includes a comparison voltage generator 311, a comparator 312, and a reference voltage compensator 313. The comparison voltage generator 311 may be configured to generate the comparison voltage VCP based on the operation mode OPM. The comparison voltage generator 311 is described with reference to FIGS. 1 to 7, and a description thereof will not be repeated here.

The reference voltage compensator 313 may compensate for the reference voltage VREF based on the temperature information TEMP received from the temperature sensor 380 to generate the temperature compensation reference voltage VREF_TC. As described above, the temperature compensation reference voltage VREF_TC may have a uniform voltage level regardless of an operation temperature of the nonvolatile memory device 300. The reference voltage compensator 313 is described with reference to FIGS. 11 to 13, and a description thereof will not be repeated here.

The comparator 312 compares one of a plurality of comparison voltages VCP1 to VCPn based on the internal voltage Vint and outputs the lock-out signal LKO depending on the comparison result.

As described above, the voltage drop detector 310 may compensate for the reference voltage VREF based on the temperature information TEMP, may generate the comparison voltage VCP based on the operation mode OPM, may compare the comparison voltage VCP and the temperature compensation reference voltage VREF_TC, and may output the lock-out signal LKO based on the comparison result. Accordingly, it may be possible to secure an operation margin of the recovery operation sufficiently regardless of a temperature change or various operation modes and to prevent an unnecessary recovery operation. This may mean that the performance of the nonvolatile memory device 300 is improved.

Figure 17:
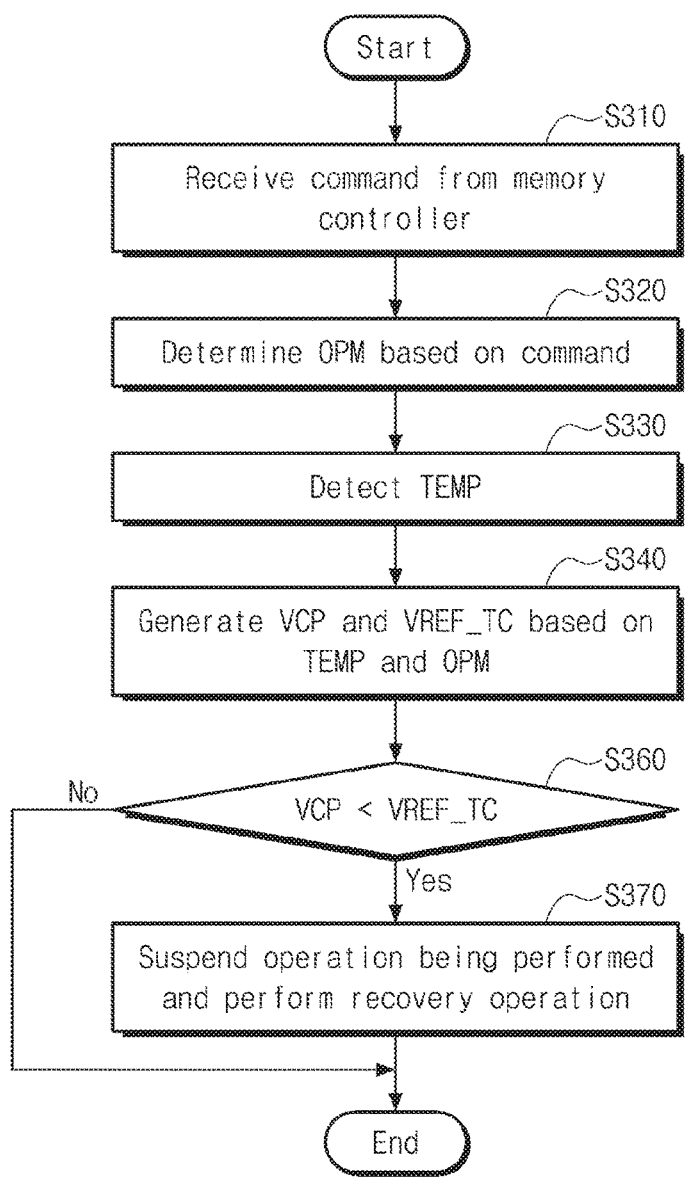
FIG. 17 is a flowchart illustrating an operation of the nonvolatile memory device of FIG. 15.

FIG. 17 is a flowchart illustrating an operation of the nonvolatile memory device 300 of FIG. 15. Referring to FIGS. 15 and 17, the nonvolatile memory device 300 performs operation S310 to operation S330. Operation S310 and operation S320 may be similar to operation S110 and operation S120 of FIG. 6, and a detailed description thereof will not be repeated here. Also, operation S330 may be similar to operation S210 of FIG. 14, and a detailed description thereof will not be repeated here.

In operation S340, the nonvolatile memory device 300 generates the temperature compensation reference voltage VREF_TC and the comparison voltage VCP based on the temperature information TEMP and the operation mode OPM. For example, as described above, the voltage drop detector 310 may generate the temperature compensation reference voltage VREF_TC based on the temperature information TEMP and may output the comparison voltage VCP corresponding to the operation mode OPM based on the operation mode OPM.

Afterwards, the nonvolatile memory device 300 performs operation S360 and operation S370. Operation S360 and operation S370 may be similar to operation S140 and operation S150 of FIG. 8, and a detailed description thereof will not be repeated here.

In an exemplary embodiment, operation S330 is continuously performed by the temperature sensor 380 of the nonvolatile memory device 300. That is, the temperature sensor 380 may detect a temperature of the nonvolatile memory device 300 periodically, randomly, or continuously and may provide the detected temperature information TEMP to the voltage drop detector 310.

Figure 18:
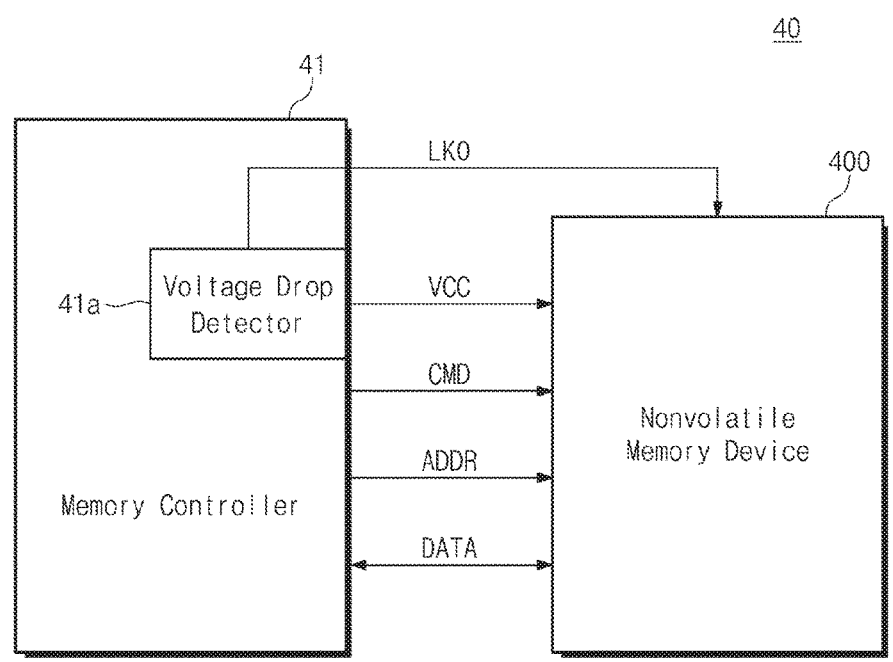
FIG. 18 is a block diagram illustrating a storage device according to an exemplary embodiment of the inventive concept.

FIG. 18 is a block diagram illustrating a storage device according to an exemplary embodiment of the inventive concept. Referring to FIG. 18, a storage device 40 includes a memory controller 41 and a nonvolatile memory device 400.

The memory controller 41 transmits the power supply voltage VCC, the command CMD, and the address ADDR to the nonvolatile memory device 400 and may exchange data with the nonvolatile memory device 400. The nonvolatile memory device 400 may operate in response to signals received from the memory controller 41.

In an exemplary embodiment, the memory controller 41 includes a voltage drop detector 41a. The voltage drop detector 41a detects a voltage drop in the power supply voltage VCC and provides the lock-out signal LKO to the nonvolatile memory device 400 depending on the detection result. The nonvolatile memory device 400 may perform the recovery operation in response to the lock-out signal LKO.

In an exemplary embodiment, the voltage drop detector 41a operates depending on the operation method described with reference to FIGS. 1 to 17. For example, the memory controller 41 may transmit the command CMD to the nonvolatile memory device 400. The command CMD may include information about an operation mode in which the nonvolatile memory device 400 will operate. That is, the memory controller 41 may recognize the operation mode of the nonvolatile memory device 400 using the information in the command CMD. The voltage drop detector 41a may generate the comparison voltage VCP based on the operation mode of the nonvolatile memory device 400, may compare the comparison voltage VCP and the power supply voltage VCC (or the internal voltage Vint), and may output the lock-out signal LKO based on the comparison result. Alternatively, the voltage drop detector 41a may generate a temperature compensation reference voltage based on temperature information received from a temperature sensor included in the memory controller 41, a temperature sensor included in the nonvolatile memory device 400, or a separate temperature sensor. Alternatively, the voltage drop detector 41a may generate a comparison voltage based on operation mode information and temperature information.

As described above, according to the exemplary embodiment of FIG. 18, the voltage drop detector 41a may be located outside (e.g., in the memory controller 41 or a separate element) of the nonvolatile memory device 400. It may be possible to output the lock-out signal LKO based on the operation method described with reference to FIGS. 1 to 17.

Figure 19:
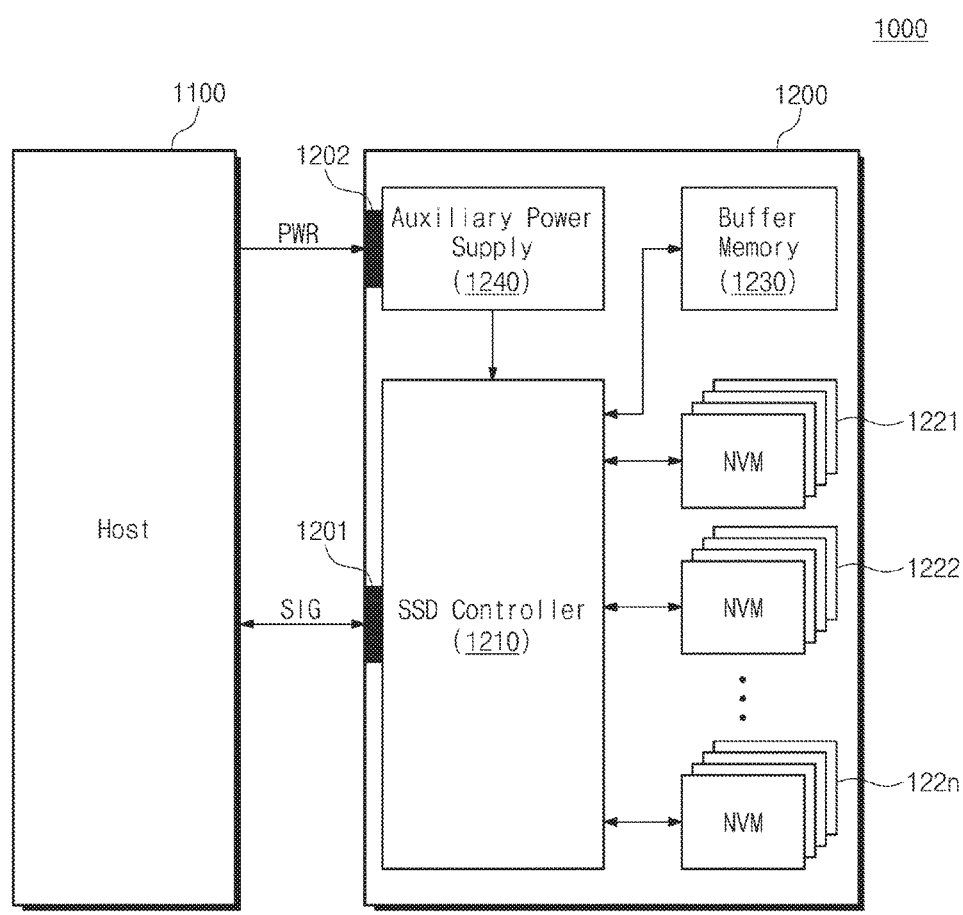
FIG. 19 is a block diagram illustrating a solid state drive system including the nonvolatile memory device according to an exemplary embodiment of the inventive concept.

FIG. 19 is a block diagram illustrating a solid state drive (SSD) system 1000 including a nonvolatile memory device according to an exemplary embodiment of the inventive concept. Referring to FIG. 19, the SSD system 1000 includes a host 1100 (e.g., a host device) and an SSD 1200.

The SSD 1200 exchanges a signal SIG with the host 1100 through a signal connector 1201 and is supplied with power PWR through a power connector 1202. The SSD 1200 includes an SSD controller 1210, a plurality of nonvolatile memories 1221 to 122n (e.g., flash memories), a buffer memory 1230, and an auxiliary power supply 1240.

The SSD controller 1210 may control the flash memories 1221 to 122n in response to the signal SIG from the host 1100. The flash memories 1221 to 122n may operate under the control of the SSD controller 1210. The auxiliary power supply 1240 is connected with the host 1100 through the power connector 1202. The auxiliary power supply 1240 may receive the power PWR from the host 1100 and may be charged by the power PWR. When the power PWR is not smoothly supplied from the host 1100, the auxiliary power supply 1240 may power the SSD 1200.

The buffer memory 1230 operates as a buffer memory of the SSD 1200. For example, the buffer memory 1230 may temporarily store data received from the host 1100 or from the flash memories 1221 to 122n or may temporarily store metadata (e.g., a mapping table) of the flash memories 1221 to 122n. Alternatively, the buffer memory 1230 may temporarily store a variety of information needed for the SSD controller 1210 to operate.

In an exemplary embodiment, each of the flash memories 1221 to 122n includes a voltage drop detector described with reference to FIGS. 1 to 18. Alternatively, the SSD controller 1210 may include a voltage drop detector described with reference to FIGS. 1 to 18 and may provide the lock-out signal LKO to each of the flash memories 1221 to 122n. Alternatively, the auxiliary power supply 1230 may include a voltage drop detector described with reference to FIGS. 1 to 18 and may provide the lock-out signal LKO to each of the flash memories 1221 to 122n.

According to at least one of the above-described exemplary embodiments of the inventive concept, a nonvolatile memory device may detect a voltage drop in a power supply voltage provided from the outside to perform a recovery operation. In this case, a voltage drop detector of the nonvolatile memory device may adjust or compensate for a reference voltage by detecting a voltage drop in a power supply voltage based on an operation mode or temperature information of the nonvolatile memory device or a combination thereof, thereby making it possible to secure an operation margin for the recovery operation sufficiently and preventing the recovery operation from being unnecessarily performed. This may mean that the performance of the nonvolatile memory device is improved.

According to the inventive concept, a reference voltage for determining a voltage drop in a power supply voltage may be adjusted based on an operation mode or temperature information of a nonvolatile memory device or a combination thereof, thereby making it possible to secure an operation margin of a recovery operation to be performed when the power supply voltage decreases and preventing the recovery operation from being unnecessarily performed. Accordingly, a nonvolatile memory device with improved reliability, an operation method thereof, and a storage device including the same may be provided.

While the inventive concept has been described with reference to exemplary embodiments thereof, it will be apparent to those skilled in the art that various changes and modifications may be made without departing from the spirit and scope of the inventive concept. Therefore, it should be understood that the above exemplary embodiments are not limiting, but illustrative.

What is claimed is:

1. A method of operating a nonvolatile memory device comprising a memory cell array comprising a plurality of memory cells, where each memory cell includes a plurality of memory blocks, the method comprising:
    determining, by the nonvolatile memory device, an operation mode from among a plurality of operation modes based on a command received from an external device, wherein each of the operation modes is associated with one of a plurality of different voltage division ratios;
    dividing, by the nonvolatile memory device, an internal voltage by the voltage division ratio corresponding to the determined operation mode to generate a comparison voltage;
    comparing, by the nonvolatile memory device, the comparison voltage with a reference voltage to generate a result; and
    performing a recovery operation on at least one of the memory cells depending on the result.

2. The method of claim 1, wherein the operation mode includes one of an idle state, a program operation, a read operation, or an erase operation.

3. The method of claim 1, wherein the operation mode includes one of a single-level cell (SLC) program operation, a multi-level cell (MLC) program operation, a single page program operation, a multi-page program operation, a single page read operation, a multi-page read operation, a single block erase operation, a super block erase operation, or a sub block erase operation to be performed in the nonvolatile memory device.

4. The method of claim 1, wherein a level of the internal voltage varies depending on the determined operation mode, and the comparison voltage has a uniform level regardless of the determined operation mode.

5. The method of claim 1, wherein the comparing includes:
    generating a lock-out signal when the comparison voltage is lower than the reference voltage, and
    wherein the lock-out signal is used as the result of the comparison.

6. The method of claim 1, further comprising:
    if the comparison voltage is lower than the reference voltage in the comparing, suspending an operation being performed in the nonvolatile memory device.

7. The method of claim 1, further comprising:
    detecting an operation temperature of the nonvolatile memory device; and
    generating a temperature compensation reference voltage based on the detected operation temperature.

8. The method of claim 7, wherein the temperature compensation reference voltage is used as the reference voltage in the comparing.

9. The method of claim 1, wherein the recovery operation decreases a voltage applied to the at least one memory cells to a specific voltage or performs a reset operation on the at least one memory cells.

10. A nonvolatile memory device comprising:
    a memory cell array comprising a plurality of memory cells, where each memory cell includes a plurality of memory blocks;
    a voltage generator configured to generate a reference voltage and a plurality of operation voltages to be provided to the plurality of memory cells, based on a power supply voltage;
    a control logic circuit configured to determine an operation mode from among a plurality of operation modes based on a command received from an external device, wherein each of the operation modes is associated with one of a plurality of different voltage division ratios; and
    a voltage drop detector configured to divide an internal voltage by the voltage division ratio corresponding to the determined operation mode to generate a comparison voltage, to compare the comparison voltage with the reference voltage to generate a result, and to output a lock-out signal depending on the result, where the lock-out signal causes a recovery operation to be performed on at least one of the memory cells.

11. The nonvolatile memory device of claim 10, wherein the control logic circuit performs the recovery operation on the at least one memory cells in response to receipt of the lock-out signal.

12. The nonvolatile memory device of claim 10, wherein a level of the internal voltage varies depending on the operation mode, and the comparison voltage has a uniform level regardless of the operation mode.

13. The nonvolatile memory device of claim 10, wherein the operation mode includes one of an idle state, a program operation, a read operation, or an erase operation or includes one of an SLC program operation, an MLC program operation, a single page program operation, a multi-page program operation, a single page read operation, a multi-page read operation, a block erase operation, a super block erase operation, or a sub block erase operation to be performed in the nonvolatile memory device.

14. The nonvolatile memory device of claim 10, wherein the voltage drop detector comprises:
a comparison voltage generator configured to divide the internal voltage by the voltage division ratio corresponding to the determined operation mode to generate the comparison voltage; and
a comparator configured to compare the comparison voltage with the reference voltage and to output the lock-out signal depending on the comparison result.

15. The nonvolatile memory device of claim 14, wherein the comparator is further configured to output the lock-out signal when the comparison voltage is lower than the reference voltage.

16. The nonvolatile memory device of claim 10, further comprising:
a temperature sensor configured to detect a temperature of the nonvolatile memory device and to provide temperature information about the detected temperature to the voltage drop detector.

17. The nonvolatile memory device of claim 16, wherein the voltage drop detector comprises:
a reference voltage compensator configured to receive the reference voltage from the voltage generator and to compensate for the reference voltage based on the temperature information to generate a temperature compensation reference voltage;
a comparison voltage generator configured to divide the internal voltage by the voltage division ratio corresponding to the determined operation mode to generate the comparison voltage; and
a comparator configured to compare the comparison voltage with the reference voltage and to output the lock-out signal depending on the comparison result.

18. A storage device comprising:
a nonvolatile memory device comprising a memory cell array including a plurality of memory cells, where each memory cell includes a plurality of memory blocks; and
a memory controller configured to provide a command to the nonvolatile memory device to control the nonvolatile memory device,
wherein the memory controller comprises:
a control logic circuit configured to determine an operation mode from among a plurality of operation modes based on the command, where each of the operations modes is associated with one of a plurality of different voltage offsets; and
a voltage drop detector configured to adjust an internal voltage by the voltage offset corresponding to the determined operation mode to generate a comparison voltage, to compare the comparison voltage with a reference voltage to generate a result, and to output a lock-out signal to the nonvolatile memory device depending on the result, where the lock-out signal causes a recovery operation to be performed on at least one of the memory cells.

19. The storage device of claim 18, wherein the recovery operation decreases a voltage applied to the at least one memory cells to a specific voltage or performs a reset operation on the at least one memory cells.

* * * * *